(12) United States Patent
Idems et al.

(10) Patent No.: US 8,472,174 B2
(45) Date of Patent: Jun. 25, 2013

(54) VIDEO DISPLAY SYSTEM

(75) Inventors: Ralph Idems, Markham (CA); Christopher John Bolton, Penrith Cumbria (GB); George Yan, North Augusta (CA)

(73) Assignee: Vertigo Digital Displays Inc., Toronto (CA)

( * ) Notice: Subject to any disclaimer, the term of this patent is extended or adjusted under 35 U.S.C. 154(b) by 282 days.

(21) Appl. No.: 12/991,328

(22) PCT Filed: May 7, 2009

(86) PCT No.: PCT/CA2009/000629
§ 371 (c)(1),
(2), (4) Date: Nov. 8, 2010

(87) PCT Pub. No.: WO2009/135308
PCT Pub. Date: Nov. 12, 2009

(65) Prior Publication Data
US 2011/0058326 A1    Mar. 10, 2011

Related U.S. Application Data

(60) Provisional application No. 61/051,197, filed on May 7, 2008.

(51) Int. Cl.
*G06F 1/16* (2006.01)
*H05K 5/00* (2006.01)
*H05K 7/00* (2006.01)

(52) U.S. Cl.
USPC ................................... 361/679.21

(58) Field of Classification Search
USPC .......................... 361/679.21–679.3
See application file for complete search history.

(56) References Cited

U.S. PATENT DOCUMENTS

| | | | | |
|---|---|---|---|---|
| 5,128,662 | A * | 7/1992 | Failla | 345/1.3 |
| 5,335,076 | A * | 8/1994 | Reh et al. | 348/794 |
| 5,410,373 | A * | 4/1995 | Sagues et al. | 348/825 |
| 5,748,269 | A * | 5/1998 | Harris et al. | 349/58 |
| 5,869,919 | A * | 2/1999 | Sato et al. | 313/17 |
| 5,991,153 | A * | 11/1999 | Heady et al. | 361/704 |
| 6,068,119 | A * | 5/2000 | Derr et al. | 206/305 |
| 6,104,451 | A * | 8/2000 | Matsuoka et al. | 349/58 |
| 6,164,369 | A * | 12/2000 | Stoller | 165/104.33 |
| 6,212,068 | B1 * | 4/2001 | Rooyakkers et al. | 361/679.04 |
| 6,343,006 | B1 * | 1/2002 | Moscovitch et al. | 361/679.04 |
| 6,367,934 | B1 * | 4/2002 | Salesky et al. | 353/74 |
| 6,437,974 | B1 * | 8/2002 | Liu | 361/679.27 |
| 6,493,440 | B2 * | 12/2002 | Gromatzky et al. | 379/161 |
| 6,532,152 | B1 * | 3/2003 | White et al. | 361/692 |
| 6,575,541 | B1 * | 6/2003 | Hedrick et al. | 312/223.1 |
| 6,966,617 | B2 * | 11/2005 | Chen et al. | 312/7.2 |
| 7,180,735 | B2 * | 2/2007 | Thomas et al. | 361/679.56 |

(Continued)

*Primary Examiner* — Adrian S Wilson
(74) *Attorney, Agent, or Firm* — Panitch Schwarze Belisario & Nadel LLP

(57) ABSTRACT

A video screen enclosure is disclosed for housing a flat panel video display unit ("FPD"), comprising a housing and a front panel member joined to the housing with an airtight seal. An environmental control unit ("ECU") within housing includes means to internally circulate air within said enclosure to maintain a temperature within a range suitable for operation of said display, and a control system to maintain the interior temperature within said enclosure within a selected range suitable for operation of said FPD. The enclosure may form a sealed unit with interior air being recirculated through said ECU, or ambient air may be circulated through the enclosure.

16 Claims, 25 Drawing Sheets

U.S. PATENT DOCUMENTS

| | | | |
|---|---|---|---|
| 7,337,024 B1* | 2/2008 | Graham | 700/79 |
| 7,463,487 B2* | 12/2008 | Kim | 361/715 |
| 7,522,416 B2* | 4/2009 | Kim et al. | 361/695 |
| RE42,091 E* | 2/2011 | Moscovitch et al. | 361/679.04 |
| 8,004,648 B2* | 8/2011 | Dunn | 349/161 |
| 8,016,670 B2* | 9/2011 | LeMay et al. | 463/30 |
| 8,235,335 B2* | 8/2012 | Sato et al. | 248/176.3 |
| 2002/0154255 A1* | 10/2002 | Gromatzky et al. | 349/60 |
| 2003/0205951 A1* | 11/2003 | Lambert | 312/7.2 |
| 2004/0000390 A1* | 1/2004 | Stadjuhar et al. | 165/80.2 |
| 2005/0105259 A1* | 5/2005 | Lee et al. | 361/681 |
| 2006/0077636 A1* | 4/2006 | Kim | 361/688 |
| 2006/0274493 A1* | 12/2006 | Richardson et al. | 361/683 |
| 2007/0045306 A1* | 3/2007 | Hirano et al. | 219/757 |
| 2008/0049447 A1* | 2/2008 | Jung | 362/612 |
| 2008/0055849 A1* | 3/2008 | Lee | 361/695 |
| 2008/0062626 A1* | 3/2008 | Ryman et al. | 361/681 |
| 2008/0068798 A1* | 3/2008 | Hendrix et al. | 361/696 |
| 2008/0123014 A1* | 5/2008 | Lin | 349/58 |
| 2008/0143918 A1* | 6/2008 | Kim | 349/58 |
| 2009/0128729 A1* | 5/2009 | Dunn | 349/58 |
| 2009/0184893 A1* | 7/2009 | Yang | 345/60 |
| 2009/0225240 A1* | 9/2009 | Suzuki et al. | 348/843 |
| 2009/0231807 A1* | 9/2009 | Bouissiere | 361/690 |

* cited by examiner

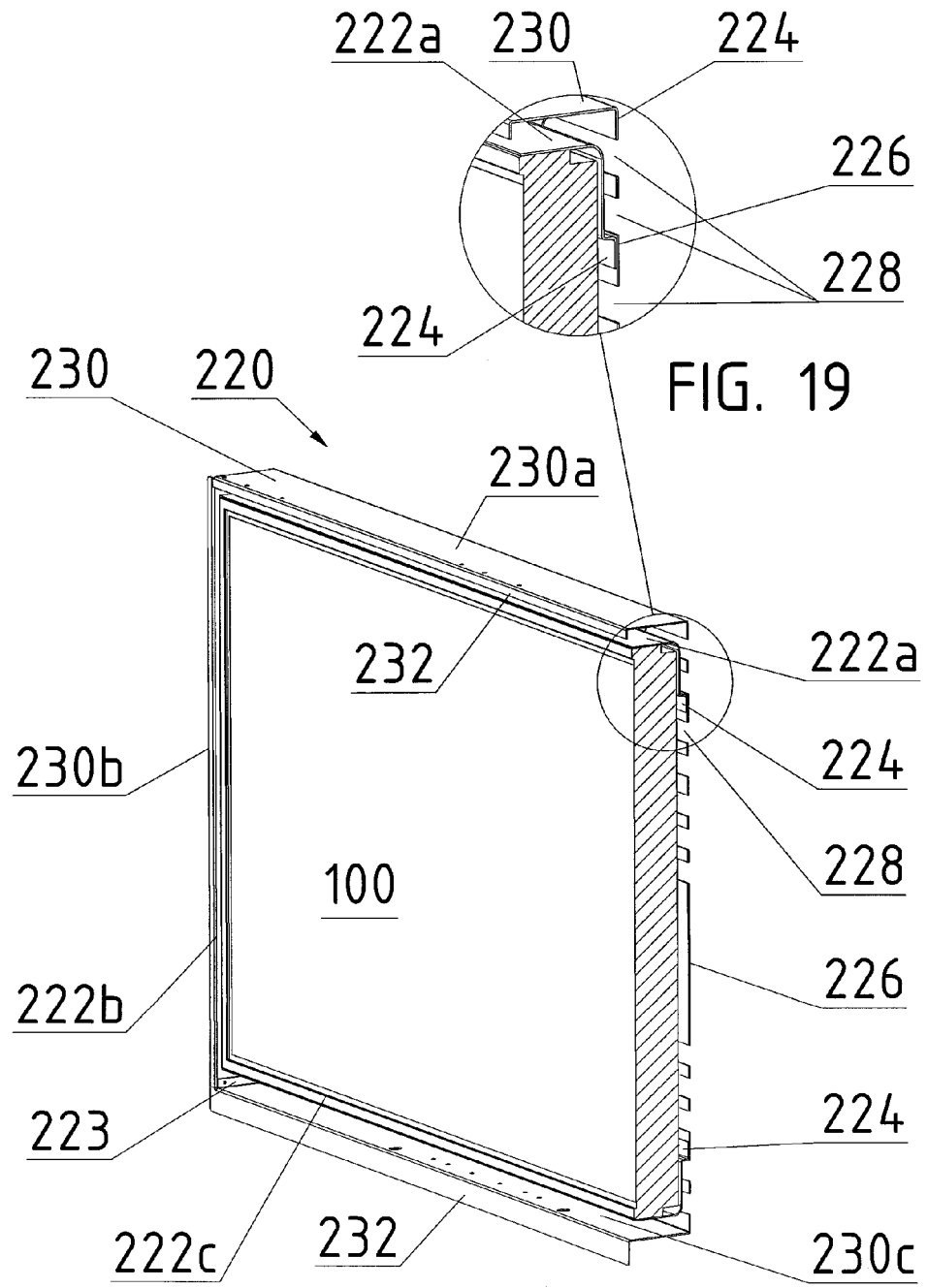

VIDEO DISPLAY SYSTEM

CROSS-REFERENCE TO RELATED APPLICATION

This application is a section 371 of International Application No. PCT/CA2009/000629, filed May 7, 2009, which was published in the English language on Nov. 12, 2009 under International Publication No. WO 2009/135308 A1 and the disclosure of which is incorporated herein by reference.

FIELD OF THE INVENTION

The present invention relates to video display systems for use in public spaces, and in particular to an enclosure for holding a flat panel video display, environmental control systems for controlling the interior environment of such enclosures, and display structures incorporating such enclosures.

BACKGROUND OF THE INVENTION

Advertising and marketing displays often consist of non-static images, such as video images and other digital displays. For example, large-scale digital displays are widely used in major urban centers, as well as in stadiums, arenas, exterior walls of buildings and other applications. There exists an increasing need for smaller scale displays that are capable of displaying a static or dynamic video image so as to better attract the attention of onlookers. Displays of this nature may be used for advertising, public service information, and the like. As used in this patent specification, the terms "video display" or "flat panel display" encompasses any type of image display, whether for commercial advertising or other purposes. Preferably, such a display is a digital static or dynamic video display, but other video display types are known.

There is a need to provide video display systems that are suitable for use as a street or floor-level display for use in a harsh environment, such as outdoor use in locations where the units may be exposed to direct sun, and other situations of extreme heat or cold. Flat panel display screens, such as LCD panels, provide a high degree of resolution and are well-suited for displaying advertising and other images on a smaller scale, for example street-level displays. As well, advances in LCD and other flat panel screen technologies have permitted very bright display capabilities, making this technology in principal suitable for outdoor use in direct or near-direct sunlight. However, apart from certain closely monitored environments such as airports and retail stores, exposed video units can be exposed to vandalism and theft. As well, outdoor use of an exposed screen is usually difficult as a result of exposure to moisture and extreme temperature conditions. One solution is to enclose a video screen within a housing or enclosure. An enclosure may also find uses in indoor settings, where for security or other reasons it is desired to encase the video display unit within a robust enclosure.

Conventional LCD monitors are suitable for operation in a temperature range of approximately 5° C. to 40° C. At temperatures above this range, the screen may not function and may be temporarily or permanently damaged, while below this range the display may also not function properly. This presents a drawback for outdoor usage of LCD displays (and other flat panel digital monitors) that are enclosed within a housing, since temperatures can exceed this range. The interior of such an enclosure can experience a greatly elevated temperature, resulting from the combination of internally-generated heat from the video monitor, as well as absorbing of heat from the sun. There is therefore a need to provide a system which includes a secure enclosure for a flat panel digital display unit, but which is capable of maintaining a suitable temperature range for a video unit. Thermal management of the system should be provided in a manner which is efficient, reasonably quiet and reliable within a range of conditions.

SUMMARY OF THE INVENTION

There is a need for a free-standing display system such as a kiosk, which may be placed in a variety of locations such as public plazas, sidewalks and the like. Such a system offers a high degree of flexibility for marketers and is desirable for modern marketing techniques.

It is an object of this invention to provide an enclosure for a digital display unit, such as a video display, that is suitable for a street-level or indoor display and which may be incorporated in a variety of display systems such as free-standing kiosks and other displays. For this purpose, it is an object to provide an enclosure that provides a degree of thermal regulation and control to permit the device to operate in harsh outdoor environments.

According to one aspect, the invention relates to a video display system which includes an enclosure suitable for use in a range of conditions including outdoor street-level use, and a display unit such as a video flat panel display. The video unit preferably comprises an LCD unit. However, it will be understood that the "flat panel display" (herein referred to as an "FPD") may include essentially any video display means such as a flat screen LCD, LED, plasma or OLED display, as well as other video systems whether currently in use or which may be developed in the future, whether based on analogue or digital video signals.

The enclosure comprises a substantially sealed housing that contains an FPD, an environmental control unit ("ECU") to regulate the internal temperature within the enclosure, and other components. A clear front panel permits viewing of the FPD. The enclosure is openable, preferably by opening of the housing portion which contains the front panel. To prevent unauthorized access to the enclosure, the housing is securely lockable. Preferably, the housing is configured to permit multiple enclosures to be joined together in various configurations. For example, multiple enclosures may be configured to be combined to form a self-supporting triangular display structure.

The enclosure includes means to mount the FPD within its interior. The FPD is located to provide an air gap, to permit airflow around the FPD to provide efficient cooling thereof or, in some circumstances, heating. The enclosure also includes means to circulate air through the air gap.

The ECU may include a heat exchanger such as an air conditioner. According to this aspect of the invention, the enclosure is effectively sealed against ambient air circulation, with interior air being recirculated through the enclosure. According to this aspect, the system is configured to provide a closed-loop, system-level approach to cooling which reduces or eliminates the need to provide individual component-level cooling, thereby permitting the system to operate in a diverse range of conditions including at least some outdoor environments. It is contemplated that units installed in less extreme or sheltered outdoor environments, such as transit shelters or the like, can utilize smaller air conditioners or heat-exchangers. Optionally, a heater may be provided to maintain a selected minimum temperature, depending on the environment in which the enclosure is to be installed. Units to be installed in indoor controlled environments could be equipped with only circulating fans. The ECU is responsive to sensors which detect conditions such as the temperature within the enclosure, the power requirements of the system, tampering or movement of the system, and other conditions. The ECU includes a control system which responds to such parameters and conditions by controlling the fan speed (thereby controlling internal air circulation), depowering the FPD, transmitting an alarm signal to a remote operator, and other responsive measures.

According to another aspect of the invention, the enclosure and ECU are configured to permit the system to maintain the desired temperature range by circulation of ambient (exterior) air through the enclosure. Optionally, a heater may be provided to maintain a selected minimum temperature.

Another aspect relates to an enclosure in which the housing consists of a rear portion which houses the FPD and ECU, and a front portion which includes a clear panel. The FPD is retained within a structure which is in turn pivotally mounted to the rear portion of the housing. The front portion and FPD are both releasably mounted to the rear housing portion with pivotal engagement means configured to permit the front portion and said FPD to independently pivot outwardly from said housing along parallel axes of rotation to permit access into the interior of said housing. At least one of said pivotal engagement means comprises mutually engaging surfaces projecting from said means to mount said FPD and said housing respectively, configured to oppose each other and rest one upon the other. The mutually engaging surfaces comprise upwardly and downwardly projecting surfaces respectively, configured to interlock when engaged.

Another aspect relates to a locking mechanism for locking the openable cover to the housing in a secure fashion.

According to another aspect, the invention relates to a display system comprising a plurality of enclosures as described above incorporated into a display system. The enclosures are mounted within a frame, which may be free-standing to form a kiosk-like structure, or alternatively incorporated into a structure such as bus shelter. Preferably, the enclosures are disposed at an angle relative to each other. For example, the system may comprise a rectangular or triangular cross-sectional configuration, with two or more outwardly-facing surfaces of the system comprising video display surfaces. In a preferred version, the systems has a triangular cross-sectional configuration with vertical side walls, with two of the faces comprising outwardly-facing video displays disposed at an angle to each other. The third face comprises a sealed panel, which is openable for access to the interior. An alternative configuration is to provide two enclosures in back-to-back arrangement. This arrangement may be ceiling-mounted. A still-further alternative is to provide a single enclosure for wall mounting. The display system may form a substantially enclosed structure, in which the FPD enclosures form some or all of the side panels, with the upper and lower faces being covered with panels. Active or passive ventilation within the interior may be provided via suitable ventilation ducts.

BRIEF DESCRIPTION OF THE DRAWINGS

FIG. 18 is a perspective view of the FPD holder portion of the sixth embodiment of the invention.

FIG. 19 is a detailed view of the circled portion of FIG. 18.

DETAILED DESCRIPTION

Figure 1:
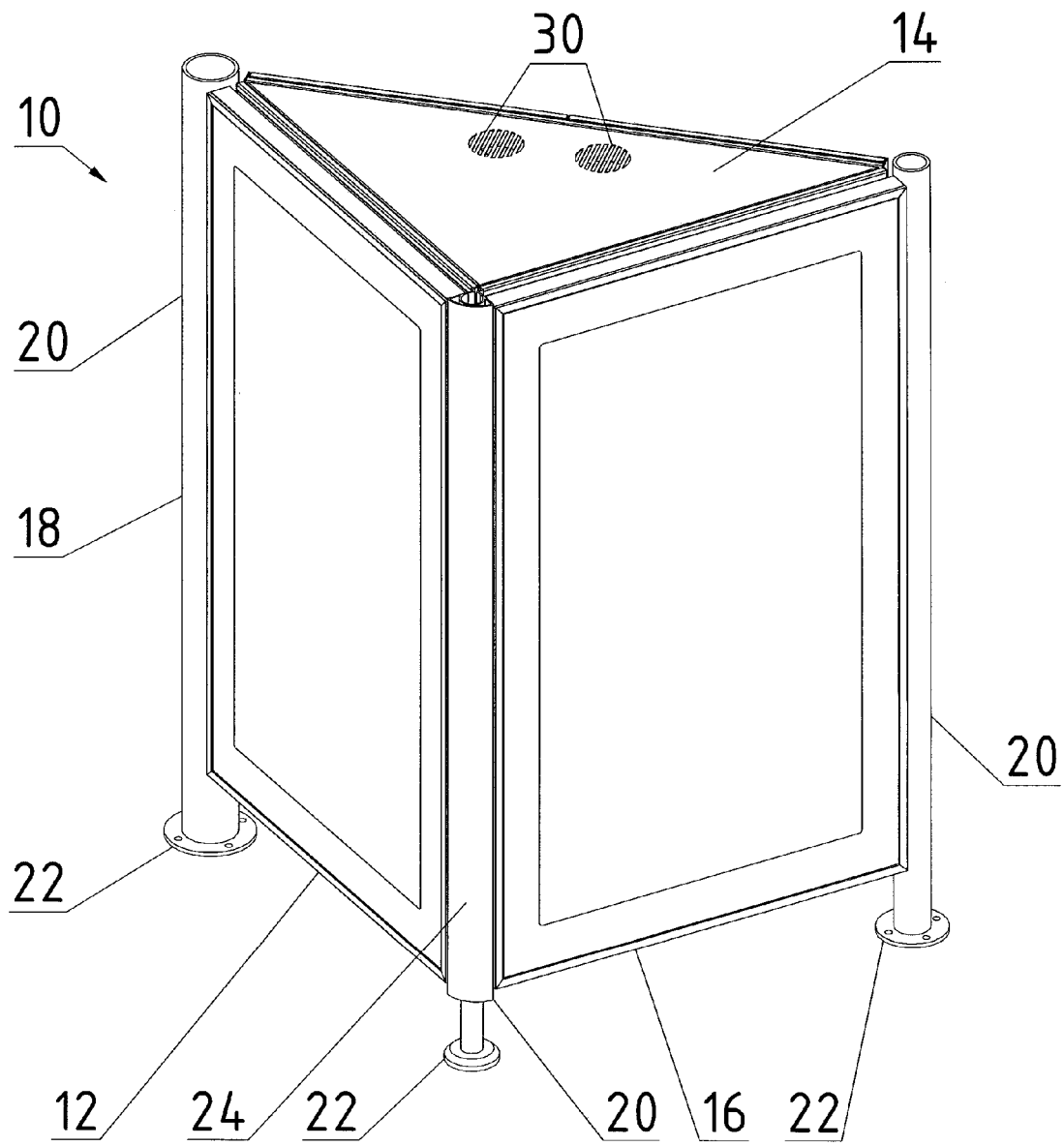
FIG. 1 is perspective view of a video display module in accordance with the present invention.
Figure 2:
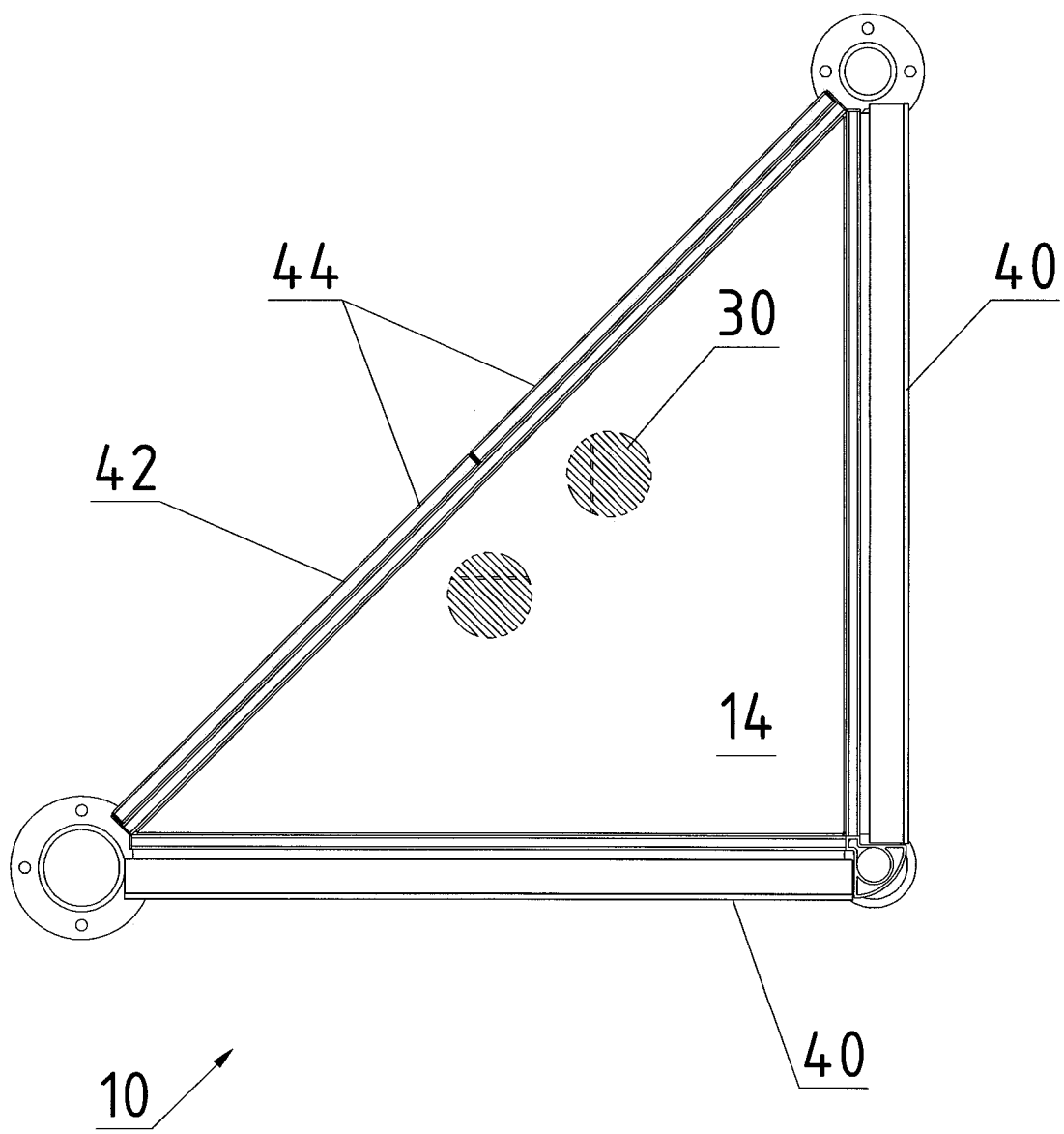
FIG. 2 is a plan view, from above, of the display module of the first embodiment.
Figure 3:
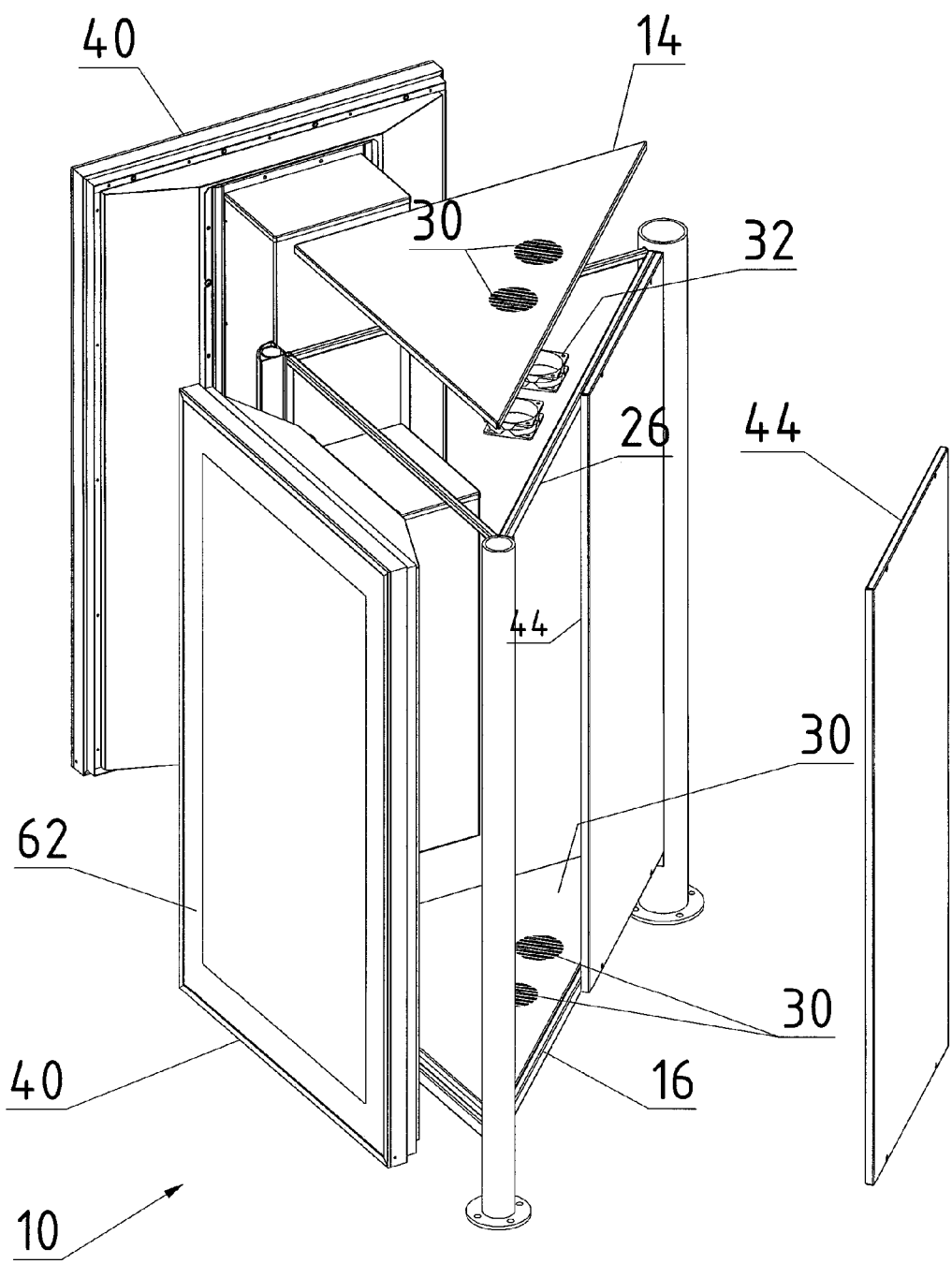
FIG. 3 is an exploded view, in perspective, of the first embodiment.

In a first embodiment, shown in FIGS. 1-8, the system comprises a free-standing display structure 10 having a substantially triangular cross-sectional configuration, with generally vertical rectangular sides. Structure 10 includes a rigid support frame 18, composed of three upright corner posts 20, each of which terminates in a foot 22. Feet 22 may be bolted to a substrate to minimize the risk of theft or movement. One or more of posts 20 are adjustable in length. Preferably, posts 20 are partly or fully covered with a decorative covering, such as powder coated sheet metal or a stainless steel tube 24. Posts 20 are connected together with cross bars 26, seen in FIG. 3. Triangular floor and roof panels 14 and 16 cover the upper and lower open ends of the module, and are mounted to cross bars 26. The floor and roof panels include ventilation openings 30, to permit ventilation of the assembly by convection. Optionally, ventilation fans 32 may be provided to vent the interior of the module. Preferably, ventilation openings 30 are louvered and covered with filter members.

The system is supplied with power, and optionally external video and audio signals, which may be supplied via a conventional subsurface conduit which terminates in a GFCI-equipped junction box located within the interior of the system. A multiple outlet UL listed power bar is used to distribute power to all of the electrical devices contained within the system.

Structure 10 includes at least one video screen display enclosure 40, composed of separable front and rear housings 48 and 60. Enclosure 40 is fabricated from a robust material, such as stainless steel or aluminum. Each enclosure forms an independent video display unit, and it will be seen that one or more such enclosures may be arranged in various combinations or configurations to form a wide variety of display modules and systems. Structure 10 comprises two enclosures 40, forming two walls of the triangular structure, and a wall 42 forming the third side thereof and composed of one or more solid panels 44, openable to provide access to the interior of the structure. Conveniently, wall 42 comprises a pair of panels 44 which swing open, and which are securely lockable in the closed position. It is evident that variations of the above are possible, including all three sides of the structure comprising video enclosures, or only a single side, or the third side comprising another type of display, or the display structure having a different number of side walls other than three.

Figure 7:
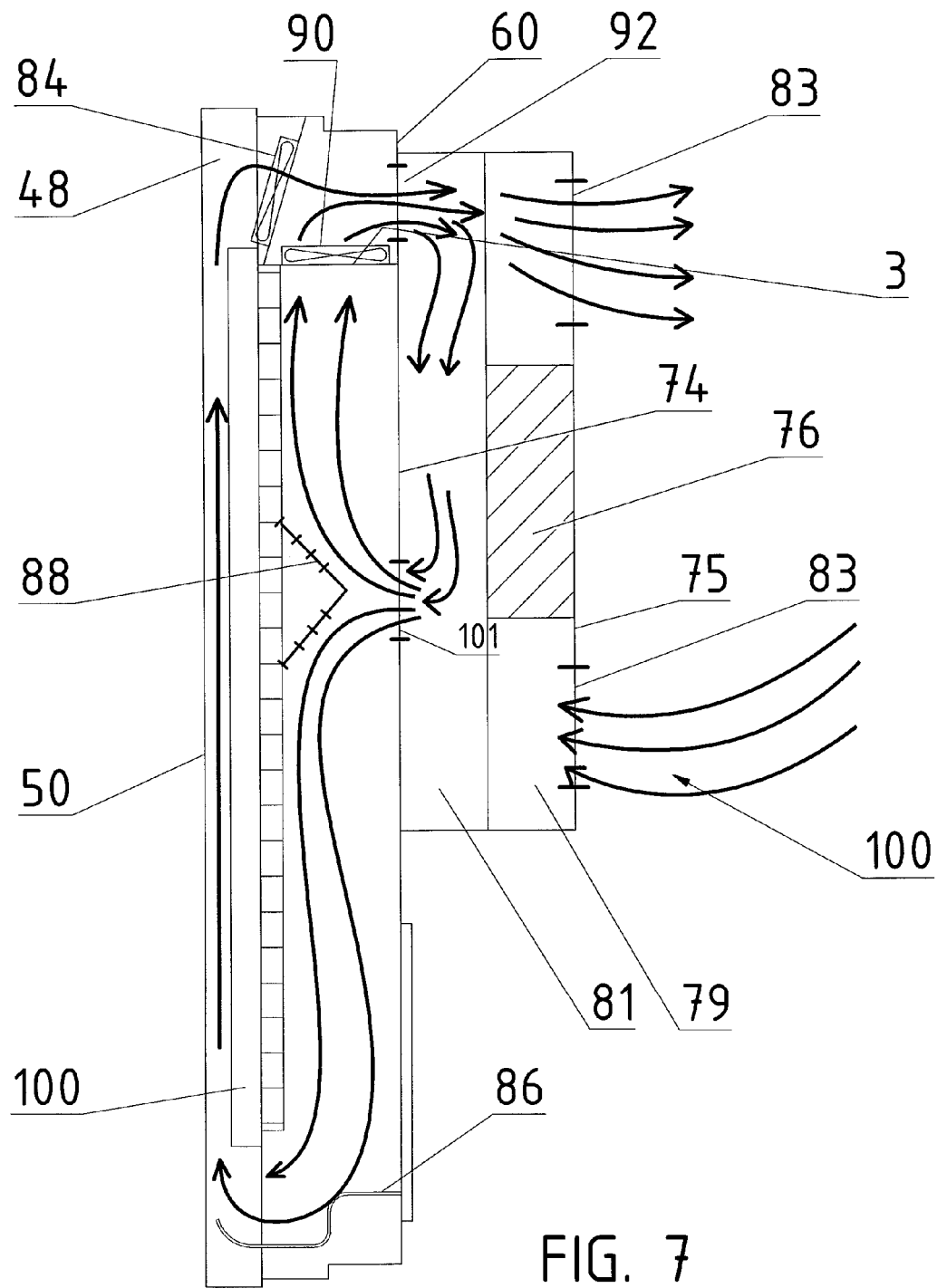
FIG. 7 is a schematic cross-sectional view along line 7-7 of FIG. 4, showing the interior of the enclosure.
Figure 8:
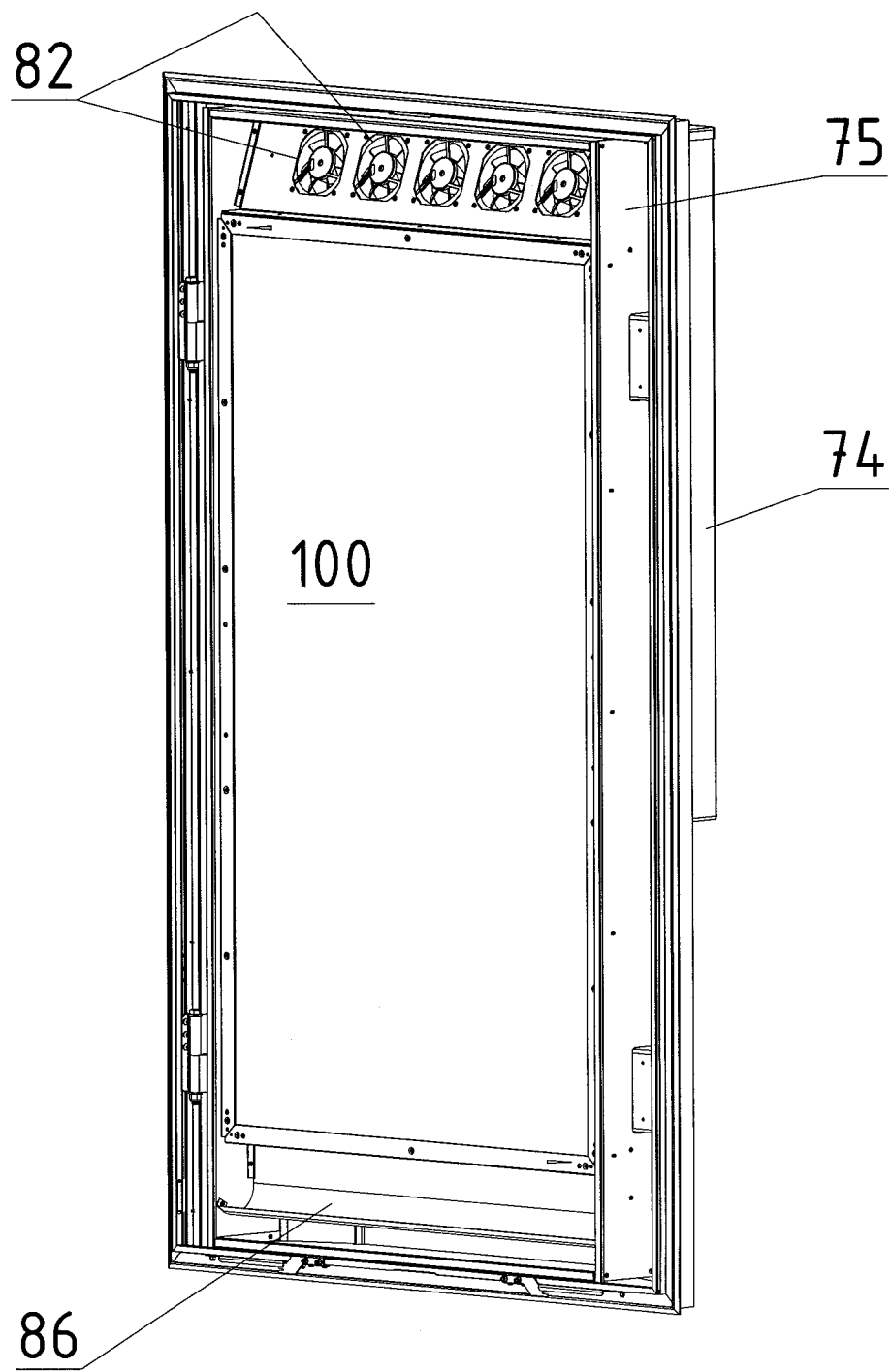
FIG. 8 is a perspective view from the front, showing the interior of the rear housing portion with a FPD installed therein and the front housing portion removed.

As seen in FIG. 7, a video flat panel display unit ("FPD") 100 is housed within enclosure 40. In the present embodiment, FPD 100 is a high-output LCD digital monitor, although essentially any video monitor may be housed within the enclosure, provided it dimensionally fits therein and has sufficient screen brightness and other desired characteristics.

Figure 4:
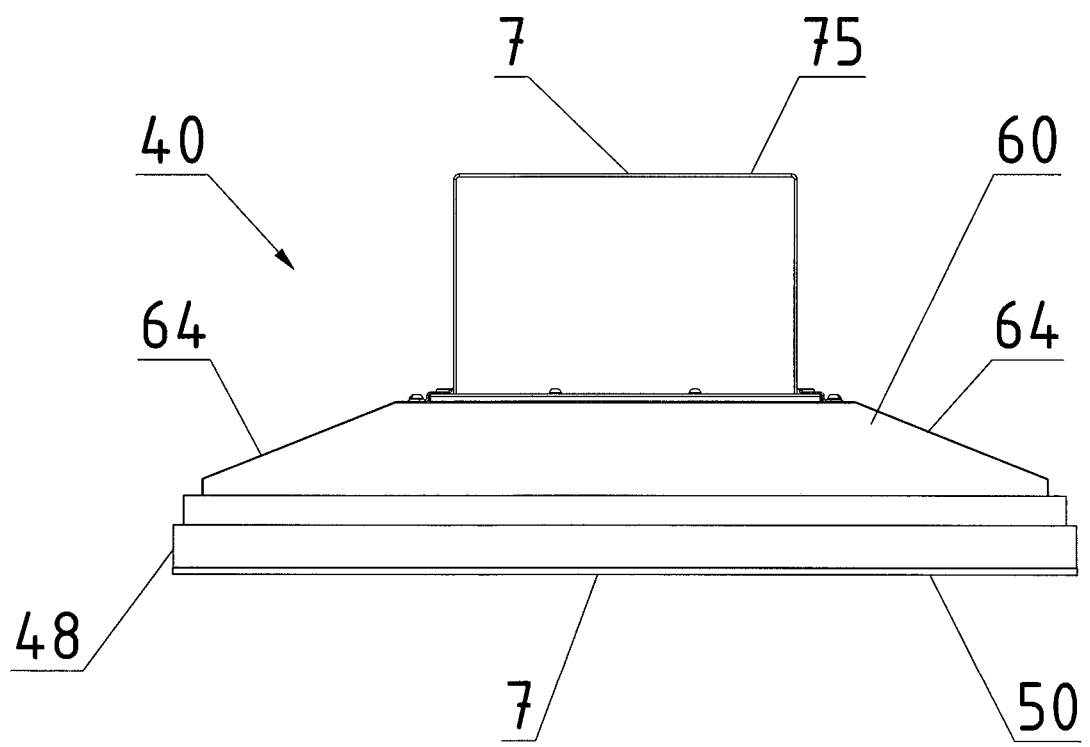
FIG. 4 is a plan view, from above, of an enclosure according to the first embodiment.
Figure 5:
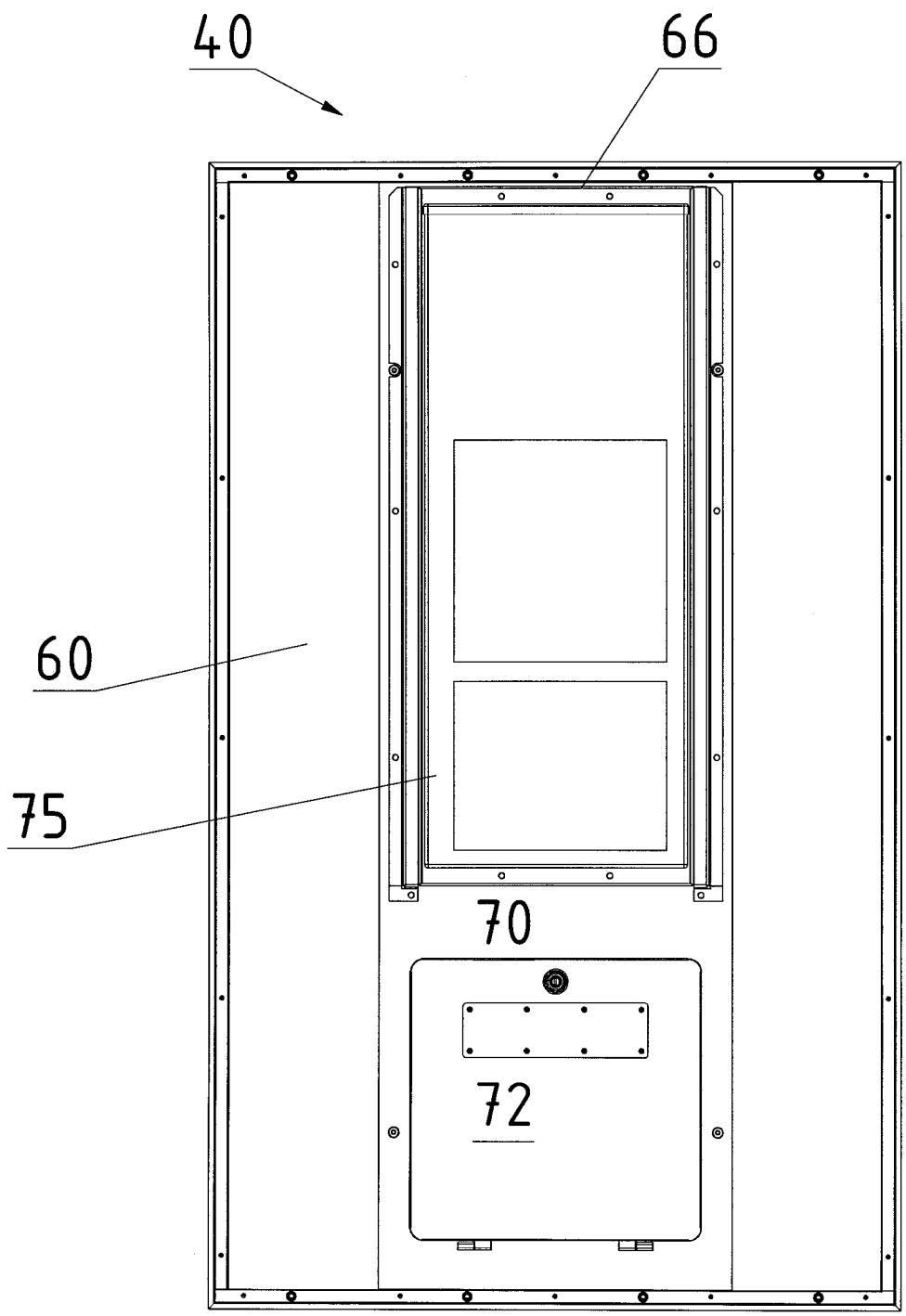
FIG. 5 is a rear elevational view of the enclosure.
Figure 6:
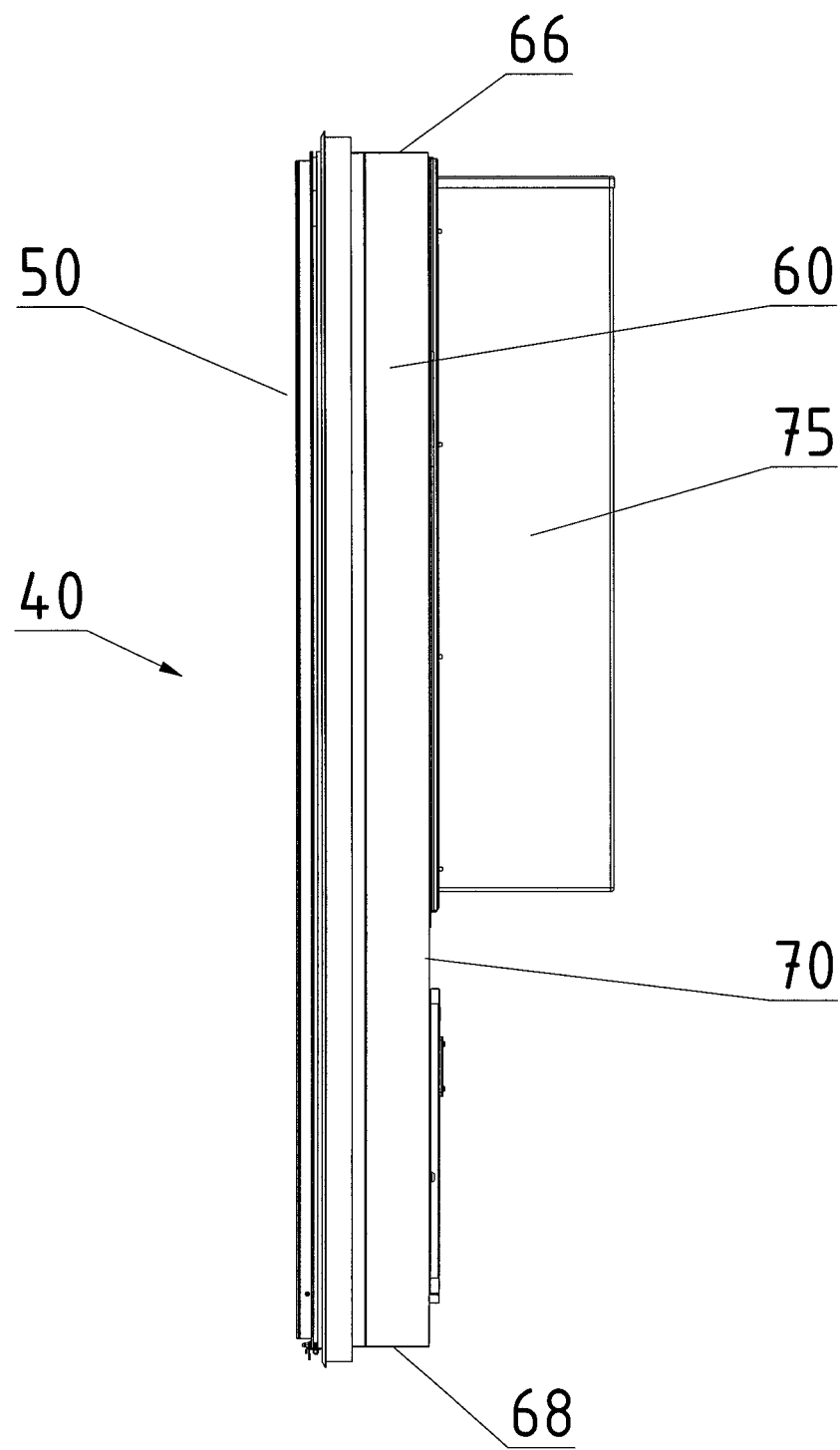
FIG. 6 is a side elevational view of the enclosure.

Referring to FIGS. 4-6, enclosure 40 comprises a self-contained substantially sealed unit. Enclosure 40 includes a front housing 48 which holds a transparent glazed front panel 50. Panel 50 is essentially inert to heat and chemicals, and has significant impact resistance, while allowing substantially no flexibility across its surface. If broken, it will shatter to form non-abrasive beads and remain intact and in place until removed for replacement. To provide sufficient security, the inventors have found that a suitable panel consists of a laminated composite of two tempered glass plates, each about 6 mm in thickness, bonded with a 1.5 mm thick optical bonding resin adhesive, resulting in a finished thickness of about 13.5 mm. It will be evident that these specifications are non-limiting, and are provided merely by way of example. The front layer is clear with an anti-reflective finish on the outside, with polished edges and a printed border matching the view dimensions of a screen of a selected maximum size. In one example, the enclosure is intended for use with a maximum screen size of 82 inches (measured diagonally), although it is evident that this is merely an illustrative example and is based on economically feasible technology as of the date of this patent specification. It is understood that rapid advances in video technology may soon result in economically viable screen sizes larger than this. In general, the structure may be scaled up or down within a range commensurate with available technology and appropriateness to the desired use of the device.

According to one embodiment, the enclosure is configured to be similar to a conventional "6 sheet" size, namely a panel size of about 4×6 feet (1200 mm W×1750 mm H). This is a conventional size used for poster-type displays incorporated into public furniture. Since conventional FPD's sized above 20" diagonal are in a ratio of 16:9, the most appropriate to this size of FPD would be a 70" LCD screen.

Front housing 48 is hinged to rear housing 60, preferably with a top-mounted hinge to permit front housing 48 to open by swinging upwardly, to permit replacement of the FPD, if required. Front housing 48 is sealed to rear housing 60, for example with a gasket or the like, and is securely latched and locked to prevent unauthorized access.

Front housing 48 may include a frame or mask 62, which may be mounted to the interior of the front panel to selectively form an opaque border around the clear front panel (see FIG. 1). This reduces the effective clear viewing area of the panel, to permit smaller screens to be mounted within the enclosure, while blocking the clear area of the panel surrounding the video screen.

Rear housing 60 comprises tapered side walls 64, converging rearwardly to permit adjacent enclosures 40 to be mounted within a display structure at an acute angle of about 60 degrees (in the case of a triangular structure) relative to each other. The angle will depend on the desired display module configuration. Upper and lower panels 66 and 68 of rear housing 60 are optionally horizontal or sloped. The enclosure includes a vertical rear panel 70, within which is mounted an openable rear access panel 72 to permit access to the interior of the enclosure, for example to access the electronic components.

An environment control unit (ECU) 74 or other air tempering unit is housed within an ECU enclosure 75, which projects rearwardly from rear panel 70. Preferably, ECU enclosure 75 is located towards the top of the unit 40 to enhance its cooling capabilities. In this embodiment, enclosure 40 is substantially sealed, and ECU 74 effectively re-circulates the air within the enclosure interior. A heat exchanger or air conditioner 76 within ECU 74 discharges waste heat to the exterior of the enclosure. For example, ECU 74 may include a 7,000 BTU a/c unit.

As seen in FIG. 7, ECU housing 75 comprises an ambient air compartment 79 open to the exterior of enclosure 40 and a closed loop compartment 81 open to the interior of enclosure 40. The respective compartments 79 and 81 form separate manifolds that are sealed relative to each other. A heat exchanger or a/c unit 76 cools the air within closed loop compartment 81, and exhausts the excess heat through ambient air compartment 79, via vents 83 within housing 75, which are open to the external environment. Vents 83 permit ambient air to circulate through the ambient air compartment 79 of ECU housing 75.

ECU 74 includes a control system which is responsive to signals from various monitors and sensors, including a monitor which measures power consumption of the electrical systems associated with the enclosure and temperature within the enclosure. ECU 74 provides thermal management of the internal environment within enclosure 40, in response to inputs from said monitors and sensors and pre-programmed values including the operating temperature range of the video screen, the expected solar heating of the enclosure, which depends in part on the relative size and thermal characteristics of the glazed front panel, as well as the characteristics of the enclosure material, and the expected outdoor temperatures in the selected environment.

ECU 74 controls the air circulation components of the system to provide thermal control within a selected range. With known conventional LCD screens, a suitable operating temperature range is about 10-40° C. or 5-40° C. It is also contemplated that the circulation fans 84 and/or 90 may be left permanently on, with the air conditioner and optionally the heater being switchable in response to the temperature within the enclosure. In extreme environments, a UPS is included to maintain the operation of air circulation fans to return the internal temperature of the enclosure to ambient in the event of a power failure. Thermal interlocks are also provided to prevent the opening of the doors before the internal temperature of the unit has returned to ambient to prevent the formation of condensation.

ECU 74 controls the environment inside the enclosure 40 so that FPD 100 is protected from variations in local weather conditions. For cooling in hot weather, or high solar loading, the ECU controls the removal of heat, for example by switching or controlling of the speed of heat modulating components including fans, air conditioners, heat exchangers, heat pipes, thermo-electric modules, motorized vents, or motorized solar shields. For heating in cold weather the ECU controls the addition of heat from electric heaters, or other sources of heat. In addition it may delay the application of power to other modules in the digital display until they have been heated to an acceptable temperature for reliable operation, referred to as "cold start" control. The ECU may also control the timing of power to other units, such as display backlights, so they are energized in an orderly and acceptable manner. The other functions of the ECU are to signal alarm conditions, such as but not limited to, intrusion alarm, high or low internal temperature, failure of cooling or heating devices, high shock or vibration, water ingress, smoke, display failure, or failure of the ECU controller itself. ECU 74 operates relatively quietly, in order to minimize the noise generated by the device.

FPD 100 is mounted within the rear housing 60. FPD 100 is mounted to maintain an air gap between its front face and front panel 50, and its rear face and the rear panel 70, and also around the upper and lower edges of the FPD. The air gap is essentially unobstructed across the full height of the FPD, to permit an air flow to pass over both sides of the FPD. FPD 100 is mounted within enclosure 40 by any suitable mounting means. For example, FPD 100 may be rear mounted by means of a Vesa™ mount, or mounting means may attach the periphery of FPD 100 in the case of open frame monitors. The gap between the FPD and front panel 50 may be approximately 1 inch, and the upper and lower gaps may be approximately 3 inches.

One or more fan banks 84 and 90 circulate air within the interior of enclosure 40. Fan bank 84 draws air through the space between front surface of FPD 100 and front panel 50, while fan bank 90 draws air through the space between the rear surface of FPD 100 and the rear wall of enclosure 40. Each fan bank 84 and 90 consists of at least one electrical fan, mounted within a fan housing. The combined airflow from fan banks 84 and 90 are directed through opening 92 within the rear of enclosure 40, and enters into closed loop compartment 81. The airflow is cooled by heat exchanger 76, and the cooled airflow then exits through discharge vent 101. A wedge-shaped baffle 88 protruding from the backside of the video monitor splits the air current into upper and lower streams, both of which flow over and chill the backside of FPD 100. The upper air stream is drawn through fans 90 for recirculation. The lower air stream flows downwardly, and contacts baffle 86, which serves as a cold air turning vane, at the base of enclosure 40. The lower stream flows downwardly towards the base of the enclosure, where baffle 86 channels the cool airflow through the lower gap between the base of the FPD 100 and the enclosure. This air current then flows upwardly through the gap between FPD 100 and the front panel 50. As the airflow passes over the upper edge of FPD 100, it is drawn through circulation fans 84, to be recirculated through ECU 74.

The present system is modular in structure, wherein each enclosure 40 may be separately assembled off site and shipped, along with the frame members and other systems components, for on-site assembly. Assembly is relatively simple, with each individual enclosure 40 comprising a "plug and play" unit which need only be plugged into the power and video signal lines or a wireless network.

Optionally, the display module 10 may be configured as a cubical or rectangular structure or alternately individual video screen enclosures may be mounted to a ceiling or floor. Other variations include back to back or side by side mounting, or surrounding a structural column.

Optionally, the enclosure includes an audio system (not illustrated). In order to provide a clear audio output without the need for external speakers, a transducer is provided to effectively transform front panel 50 into a sound driver. This may be provided, for example, with a Panasonic™ ambient speaker system, in which a full range transducer type mechanism is attached directly to the from glass panel with an adhesive pad, attached directly to the internal glass face of the display. This permits a clear audio capability without the need for openings in the sealed enclosure.

Both open frame and finished commercial screens can be housed in the enclosure. In one aspect, a high output LCD monitor, such as an MRI brightness-enhanced open-frame 70" Samsung™ monitor is used, which is effective in direct or near-direct sunlight. However, any suitable digital screen may be used in the system, and the existing screen within a unit may be replaced or upgraded.

The present system may include hardware and software that permits local or remote (web enabled) monitoring, control, and populating the FCD with user selectable advertising material, which may include material presented in display formats that are universally accepted and commonly used in the outdoor advertising industry.

The video and audio signals for the display structure 10 may originate from a common source, to permit identical video images to be displayed on all screens, or alternatively the displays and speakers may be separately controlled. The signals may comprise pre-programmed signals, which may be provided by way of audio visual playback devices mounted within the individual enclosures or within the interior of the display systems. Alternatively, the audio and/or audio-visual signals may be transmitted remotely, by wireless or non-wireless means. The programming may be either preprogrammed, for example displaying advertisements on a continuous loop, or may be remotely programmed by manual or automatic control. Remotely sourced signals may be transmitted to the displays by any suitable means including wireless transmission or fibre optic transmission means. All such means for supplying visual or audio-visual signals to the system are contemplated within the scope of this invention and would be known to persons of ordinary skill in the art.

The structure 10 may include a player module 600, comprising a hardened computer unit and associated hard drive which together control the digital content displayed on the FPD's 100. The player module communicates with a remote command centre. This enables content selected at one or more remote centres to be displayed on the screen. The player module may store such data temporarily. The player module also functions as a monitoring unit, to signal local conditions and data back to the command centres, such as the correct functioning of the display screen. By way of non-limited examples, the system permits users to customize the display of advertising content which can be controlled with user selectable criteria, such as the physical location of the device, the time and date, point of sale data, and product inventory information. In addition the player can be used to facilitate local communication with devices, such as, but not limited to, hand-held IR remotes, for local data input or for set-up or maintenance purposes. Further, it may also be used to relay audience conditions at the local site to the command centres. The remote command may be situated at one or more locations, or from sites on the Internet or a private data network, or even from mobile sites with access to such computer networks. The communication method between the Player and the remote command centre can be any high speed digital communication media, such as but not limited to, hard-wired Ethernet, wireless Internet, broadband-over-power, fiber, etc. The communication interface may be a separate module, or may be incorporated into the player module.

Optionally, at least one of the sides of the system consists of or includes a backlit poster-type display in place of an enclosure 40.

Figure 9:
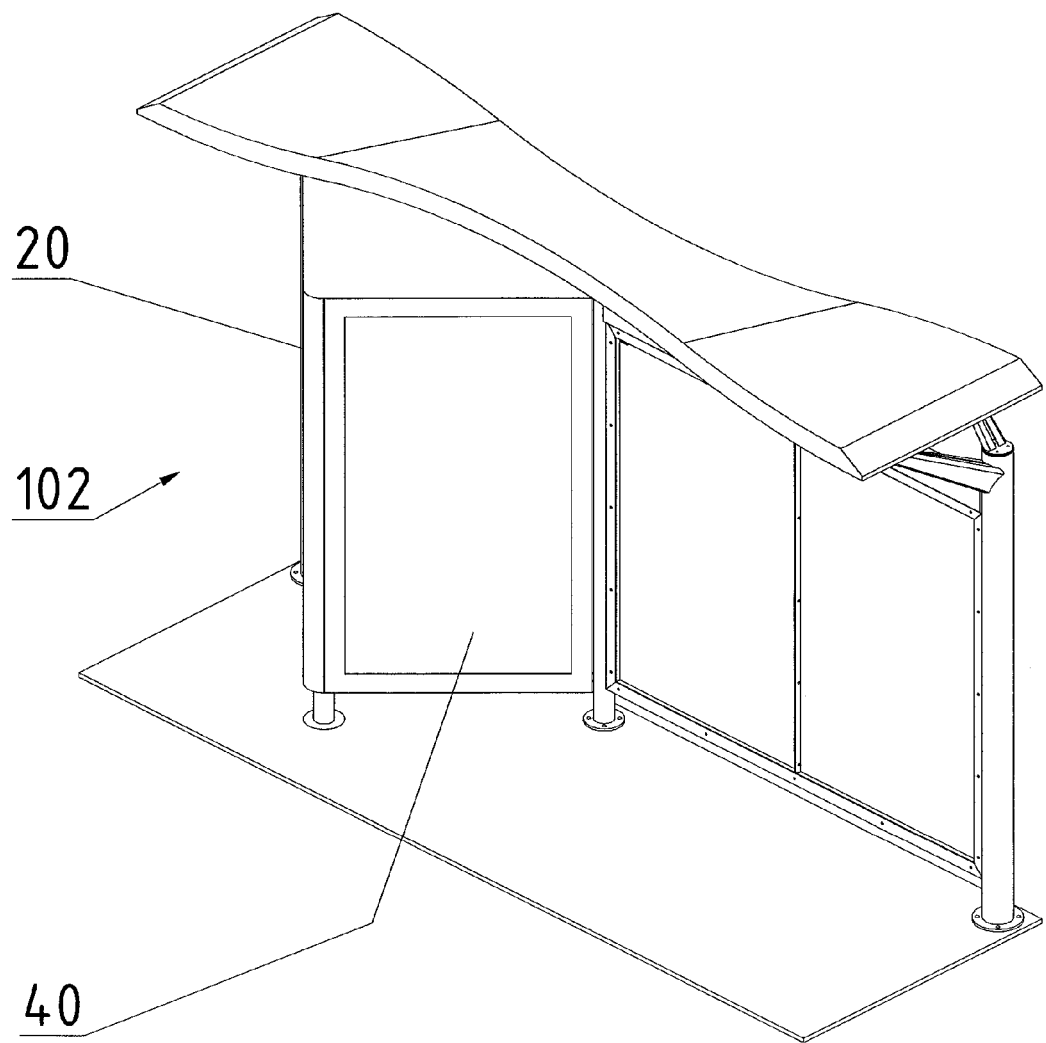
FIG. 9 is a perspective view of a second embodiment of the invention, depicting a transit shelter incorporating the present invention.

According to a second embodiment, shown in FIG. 9, one or more enclosures 40 can be incorporated within a transit shelter 102. In this aspect, posts 20 may provide structural support for the shelter, thus integrating the video display with the shelter. The video system thus provides both structural support and shelter from the elements, in addition to the video display.

Figure 10:
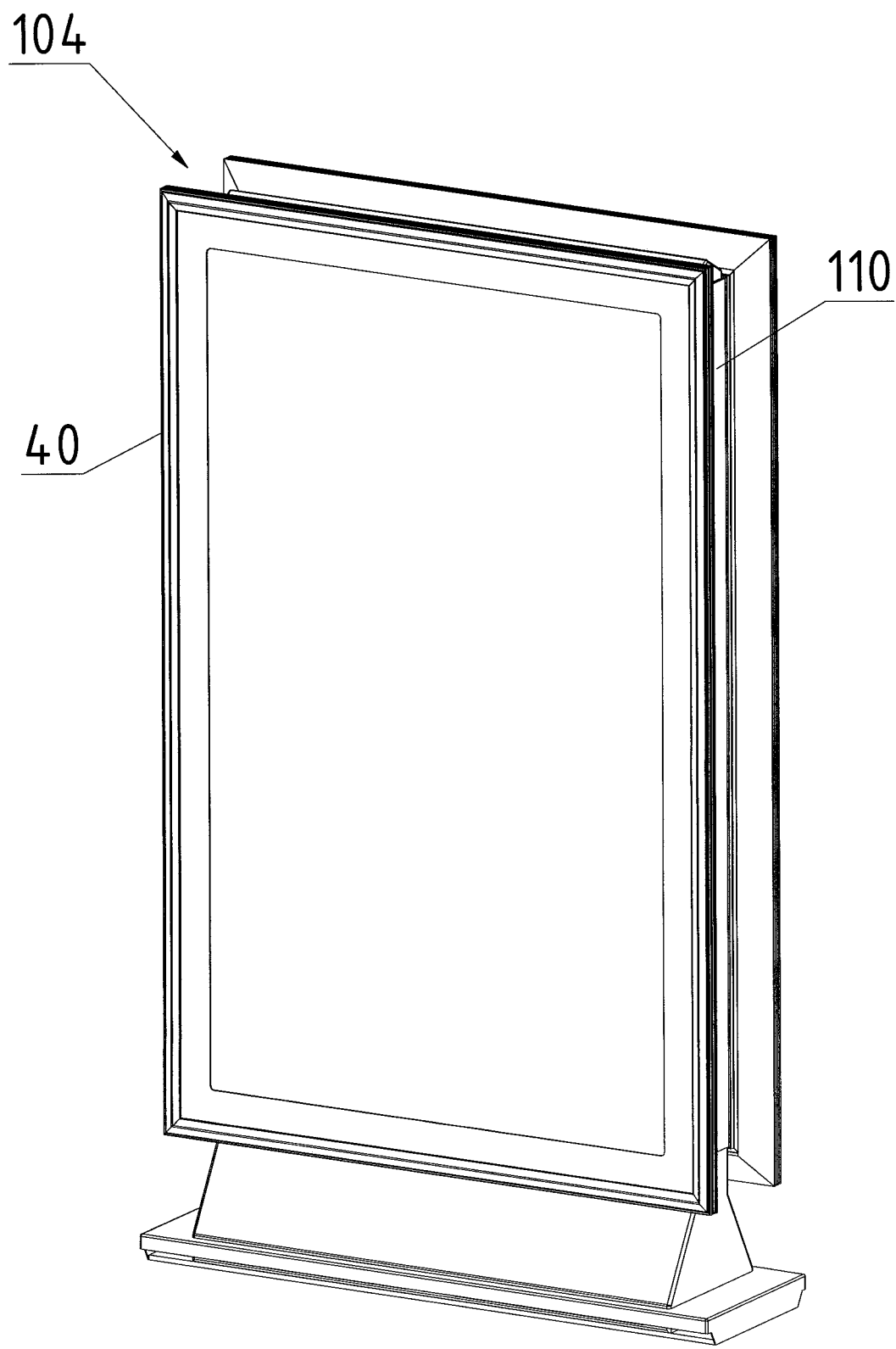
FIGS. 10 through 12 are perspective views of third, fourth and fifth embodiments of the present invention.
Figure 11:
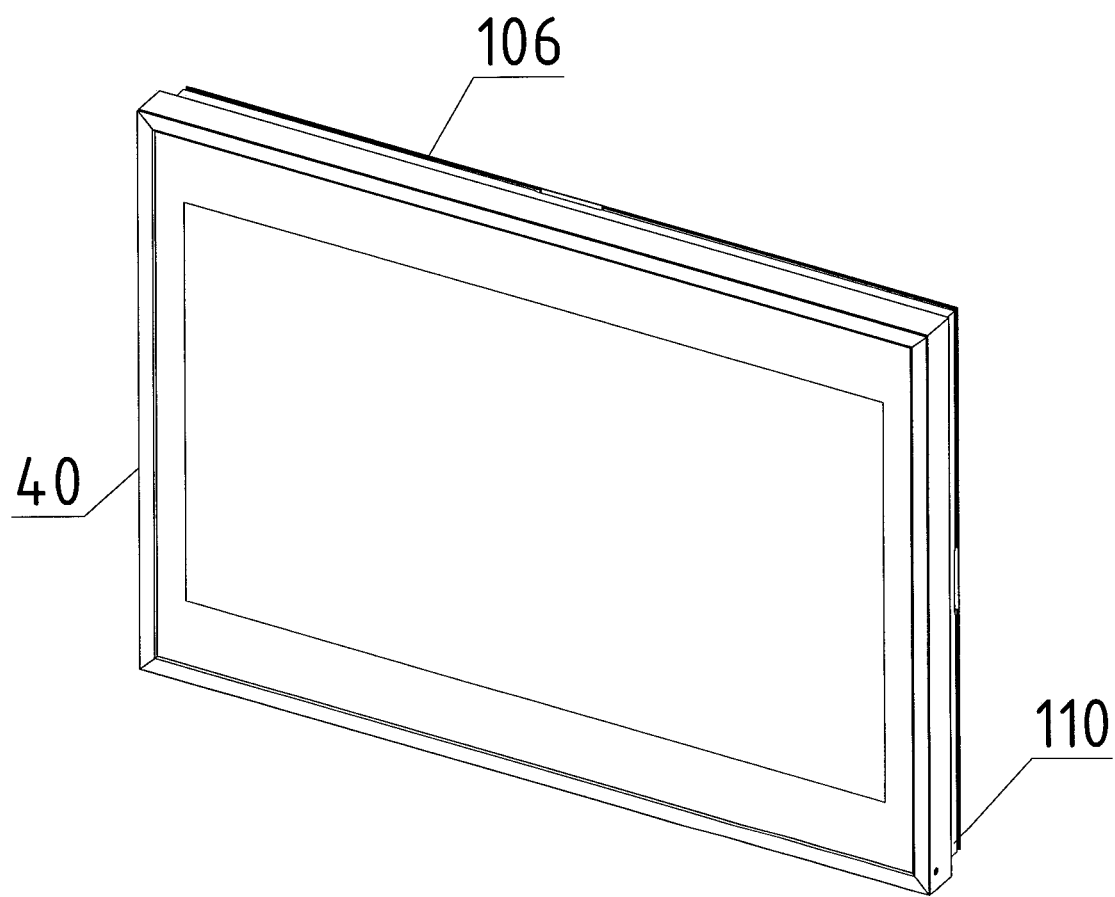
Figure 12:
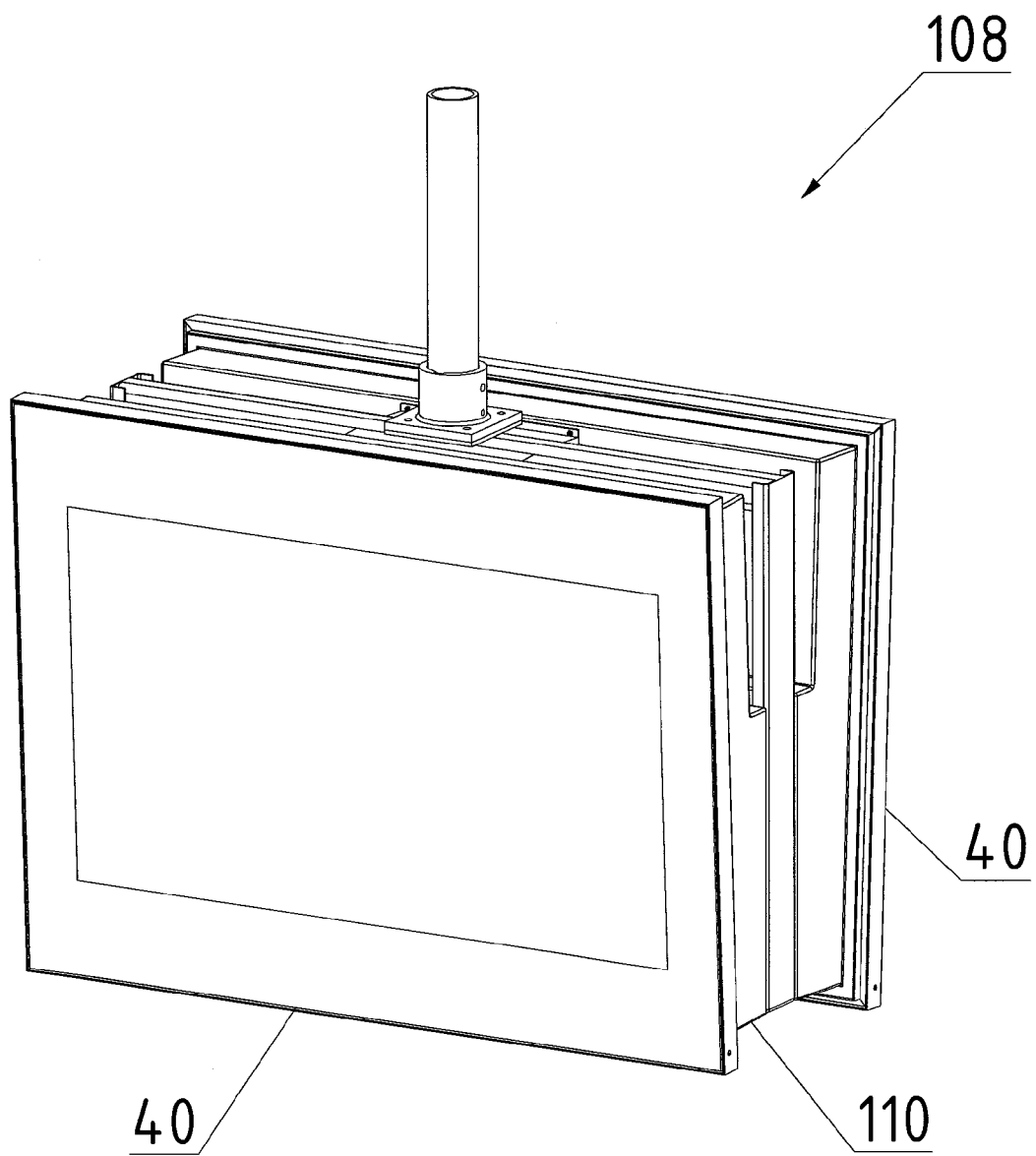
Figure 13:
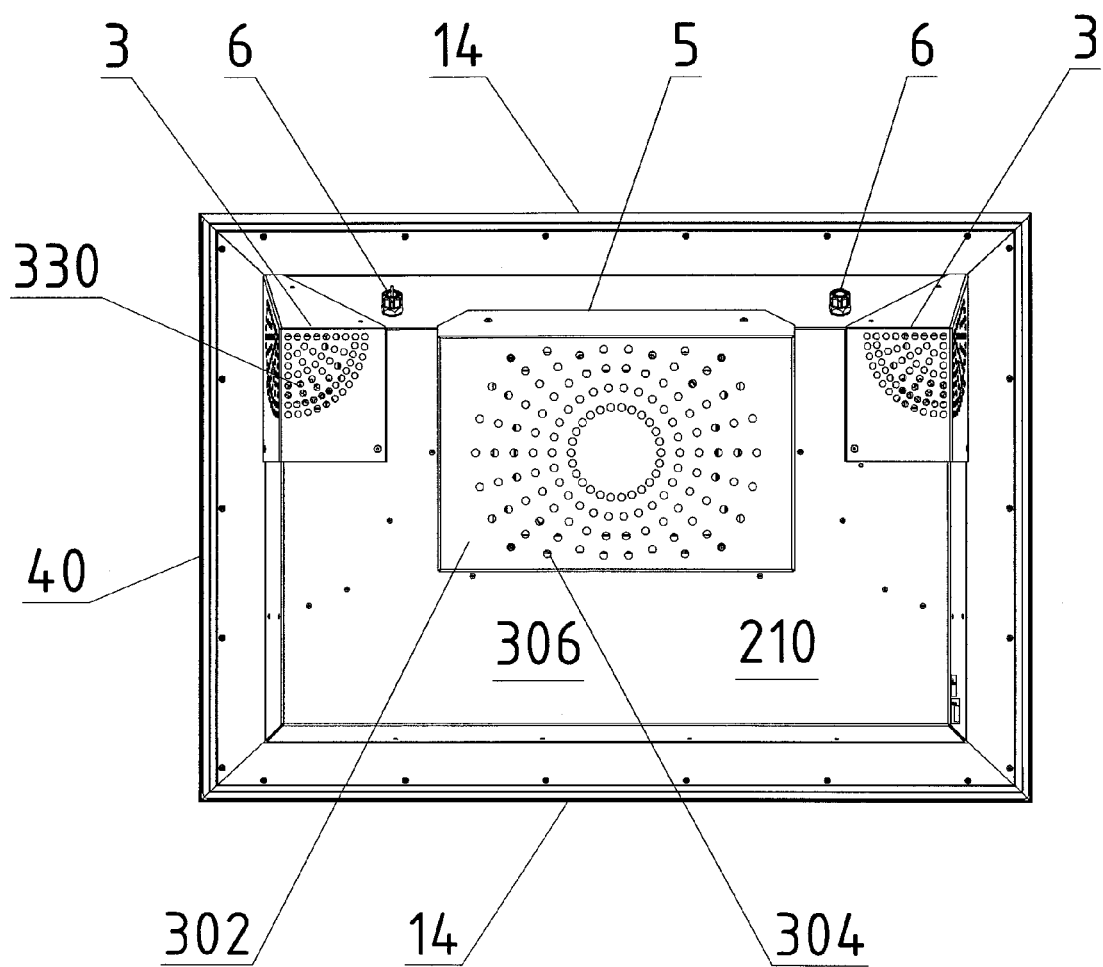
FIG. 13 is a rear plan view of a sixth embodiment of the invention.

FIG. 10 illustrates a third embodiment consisting of a single or double-sided floor-standing (street-level) display 104 composed of either a single enclosure 40, or dual enclosures 40 arranged back-to-back. FIG. 11 illustrates a fourth embodiment, consisting of a one-sided, wall-mounted display 106. FIG. 12 illustrates a fifth embodiment, consisting of a two-sided, ceiling mounted display 108. The preceding systems of FIGS. 10-12 comprise one or two enclosures 40 as generally described above, wherein the enclosures are mounted within a frame 110 which supports the enclosure(s) in a suitable configuration.

A sixth embodiment is shown in FIGS. 13-22. In this version, enclosure 40 is adapted for maintaining a suitable operating temperature within its interior without the need for active cooling by an air conditioner or other heat exchanger, by generating a flow of ambient air through the enclosure. The enclosure consists of front and rear housings 200 and 210 which open like a clamshell, connected together with a removable hinged connection means, described below in more detail. Rear housing 210 encloses the FPD 100 and the ventilation components described herein, and front housing 200 includes the clear viewing panel 50. A pliable gasket where housings 200 and 210 meet provides a watertight seal.

The hinged connection means between the housings 200 and 210 is disposed horizontally along their respective upper edges to permit the front housing to swing away from the rear housing. The connection consists of opposed mutually engaging flanges 212 and 214. A first flange 212 extends forwardly from rear housing 210 with an outer portion which projects upwardly. Flange 214 extends rearwardly from the front housing 200 with an outer portion which projects downwardly. The respective flanges engage each other to suspend front housing 200 in a manner that permits front housing 200 to pivot outwardly from rear housing 210 about a horizontal axis. The respective flanges interlock to prevent the housings from coming apart, and to lock the housings together when the enclosure is closed. When enclosure 40 is open, the respective flanges may be disengaged from each other by lifting the front housing 200, thereby disengaging the mating flanges.

Figure 21:
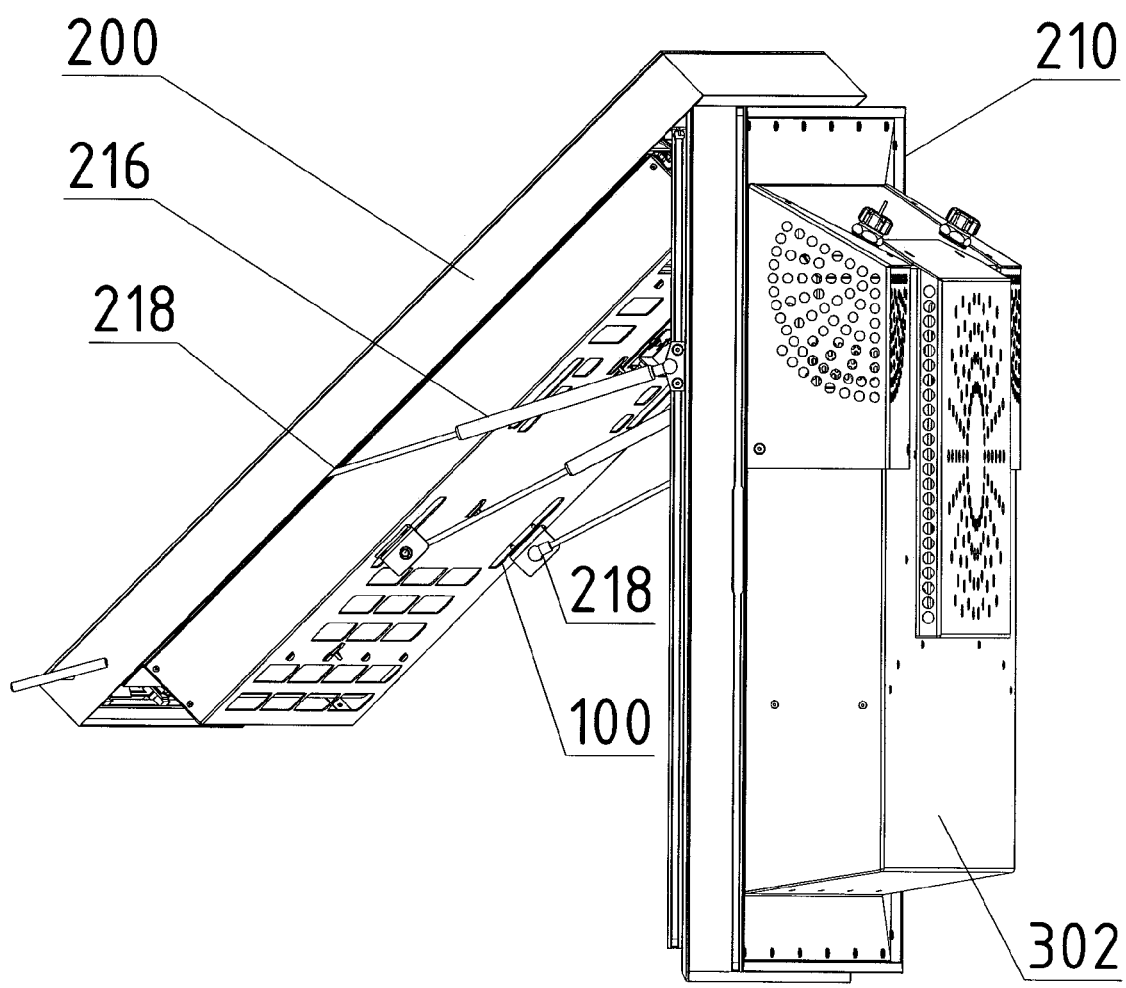
FIG. 21 is a perspective view of the sixth embodiment.

The front housing 200 is further attached to the rear housing 210 with a pair of gas spring struts 216, one on either side of the front housing 200 (see FIG. 21). Struts 216 are provided with quick release attachment members 218 where they join to the front housing, so that the front housing 200 can be fully disconnected from the rear housing 210, for example to replace the glass panel 50. Struts 216 are telescoping to permit the front housing to open, and are provided with sufficient resistance to hold to the front housing in the open position when required.

Figure 20:
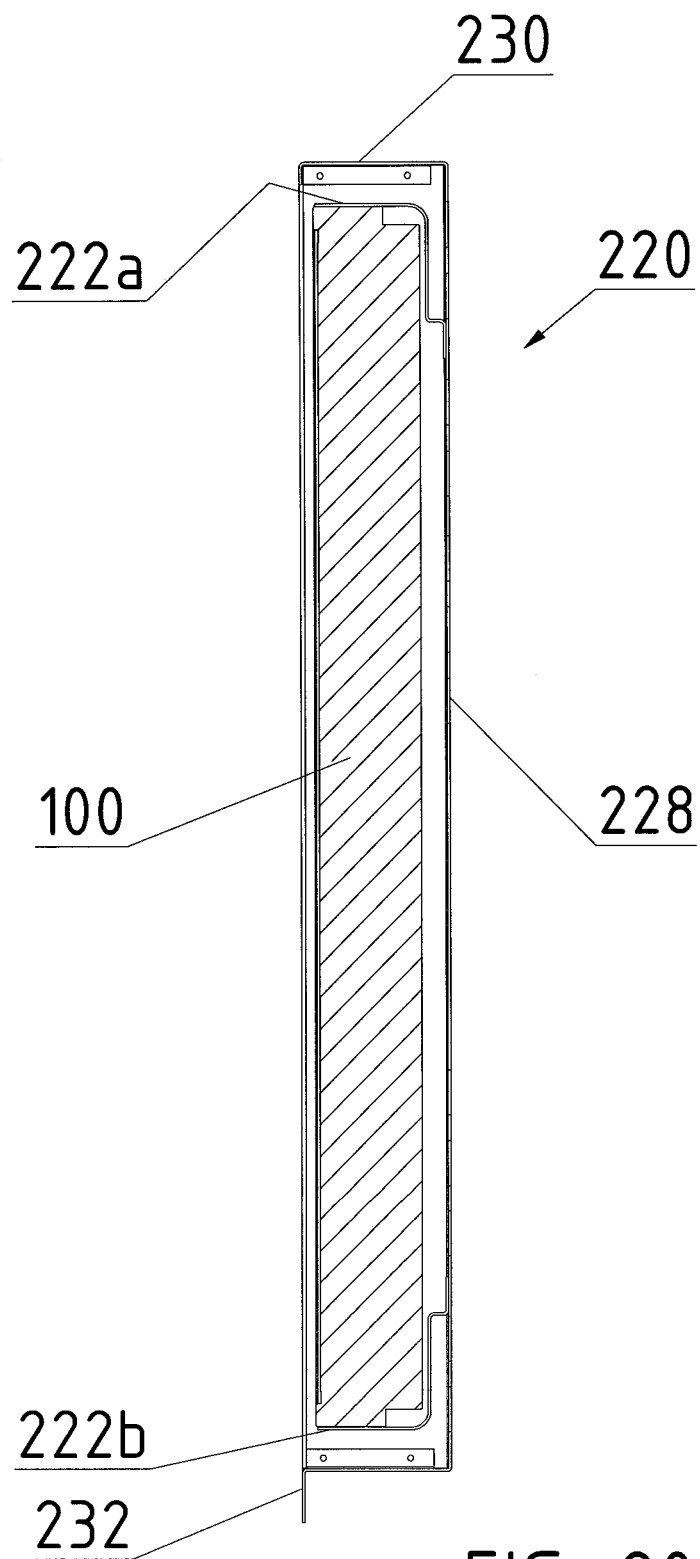
FIG. 20 is a side elevational view of the FPD holder according to the sixth embodiment.

FPD 100 is retained within a screen holder 220, seen in more detail in FIGS. 18-20, which in turn is mounted within the rear housing 210. The screen holder is configured to also channel airflow within the enclosure for ventilation of the FPD. Screen holder 220 comprises the following components:

a) a rectangular inner frame 222 dimensioned to fit a selected FPD. The inner frame comprises four frame members 222a-d consisting of inwardly-facing channel shaped members to receive the edges of the FPD. The frame members are assembled together with corner brackets 223 that fasten to frame members 222 with screws or other fastening means, to permit assembly around FPD 100. Frame members 222a-d effectively wrap around the periphery of FPD 100, slightly overlapping the front face thereof. Each frame member 222 also overlaps the rear face of FPD 100, and terminates in a flange 224 which protrudes rearwardly and includes a vertical portion.

b) a rear panel 226, having ventilation slots 228 extending horizontally therethrough. The rear panel 226 is mounted to flanges 224 so as to space the rear panel from the rear face of FPD 100.

c) an outer frame 230 which fastens to the rear panel 226, and when mounted to the inner frame 222 via the attachment of the rear panel is spaced from the inner frame. The outer frame 230 is composed of four outer channel-shaped outer frame members 230a-d (only 230a-c are shown). The outer faces 232 of frame members 230 contact panel 50 when the enclosure is closed. As well, the outer frame is configured to channel an airflow around FPD 100 to provide ventilation.

Figure 22:
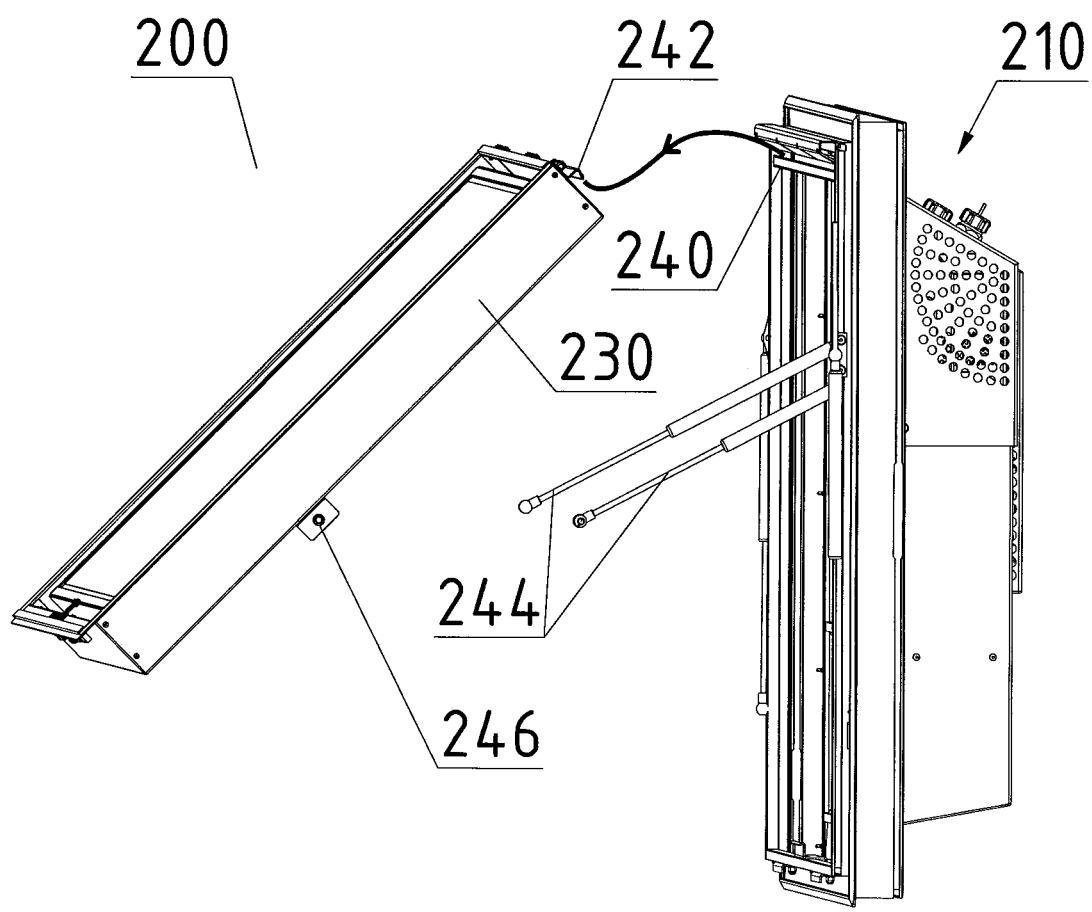
FIG. 22 is a perspective view, with components separated to show details, of the sixth embodiment.

As seen in FIG. 22, screen holder 220 is retained within rear housing 210 in a fashion which permits it to pivot outwardly from the rear housing to permit access to the interior of the rear housing. The axis of rotation of screen holder 220 is horizontal and is parallel to the axis of rotation of the front housing. The retention of screen holder 220 is via mutually engaging surfaces which operate in a fashion similar in principle to the engaging flanges holding the front and rear housings together, whereby the screen holder is suspended from the rear housing by means of mutually engaging flanges 240 and 242. Flange 240 projects forwardly from the rear housing and upwardly, and flange 424 projects rearwardly from the front housing and downwardly. The respective flanges engage each other to suspend screen holder 220 in a pivotal engagement with the rear housing 210, while permitting release of the screen holder by lifting the screen housing to disengage the respective flanges.

When front housing 200 is opened, FPD 100 may be swung outwardly for access to the rear of the housing. The screen is further fastened to rear housing 210 with a pair of gas spring struts 244 which connect the rear panel 226 of screen holder 220 to rear housing 210. Struts 244 attach to screen holder 220 with quick-release mounts 246 to permit FPD 100 to be readily detached for replacement.

Front housing 200 locks to the rear housing 210 in the closed position to prevent unauthorized access, with a robust lock that resists tampering.

The system includes an environmental control unit ("ECU") 300, which is shown together with its associated components in FIGS. 13-17, 21 and 22. ECU 300 is housed in the rear compartment 210 behind the FPD, within an ECU compartment 302. ECU compartment 302 is defined by a wall 303 which maintains airflow separation between the incoming air entering the ECU compartment, and the outgoing exhaust air exiting the enclosure 40. Wall 303 extends horizontally across the interior of the enclosure 40 so as to effectively surround the ECU. Exterior (ambient) air enters compartment 303 through perforations 304 within the rear panel 306 of the enclosure. An inlet manifold 307 within ECU compartment 302 covers the perforated region. Inlet manifold 307 houses a semi-permeable membrane 308, such as a Gore™ membrane that filters the incoming air to block liquid, particulates, etc., while permitting the inflow of air, thereby limiting the intake of moisture and contaminants into the enclosure.

The enclosure is configured to permit air circulation around the FPD to control its temperature within a useable range. As seen in particular in FIGS. 14 and 15, internal air circulation is driven in part by the venting of exhaust air from the enclosure, by exhaust fans 310 mounted within the rear housing, located near the top thereof to take advantage of heat stratification within the enclosure. Exhaust fans 310 are each housed within an exhaust manifold 311 located at an upper corner of the rear housing. Internal air circulation is further driven by an air circulation fan 312 located within a heater/blower unit 320, which in turn is mounted within the ECU compartment 302. The heater/blower unit 320 includes an air intake 324 adjacent to the intake manifold 306 to draw air into the enclosure. Air is discharged from the heater/blower unit 320 through an air outlet 326 adjacent to the rear panel 226 of screen holder 220 to discharge air into the interior thereof. The heater/blower unit 320 comprises a variable speed, high capacity unit, which when operating draws air into the ECU enclosure from the intake manifold 306.

A portion of the incoming airflow enters the heater/blower unit while the remainder of the airflow is directly circulated into the enclosure 40 without entering the heater/blower unit. Exhaust fans 310 provide additional air circulation by withdrawing heated air from the enclosure. The airflow from both paths is then channeled into screen holder 220, through the openings in the rear panel thereof. The airflow within the screen holder follows two paths, the first being under and around the front of FPD 100, and the second path being upwardly along the rear face of the FPD. Both air streams are channeled between the inner and outer FPD frames 222 and 230, which are spaced apart to provide an airflow channel. Outer frame members 230a-d effectively form baffles which channel the airflow around FPD 100.

ECU enclosure compartment 302 includes an exhaust manifold 311. The air streams circulating around FPD 100 are channeled out of enclosure 40 through outlet openings 330 within rear panel 226, which feeds into manifold 311. Exhaust fans 310 discharge the heated air from the exhaust manifold 311 into the ambient air.

Figure 14:
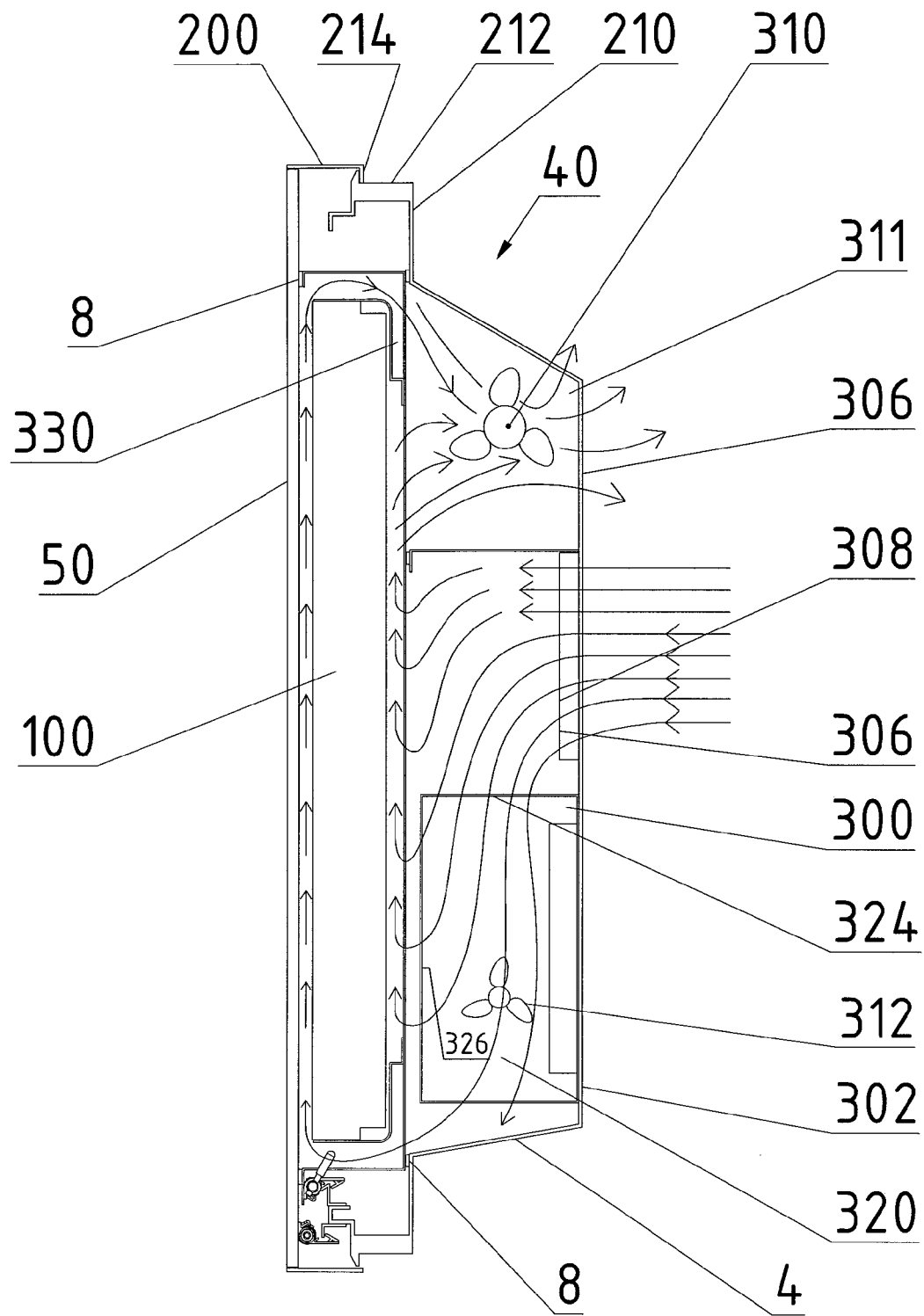
FIG. 14 is a cross section view of the embodiment of FIG. 13, along line 14-14 of FIG. 13.
Figure 15:
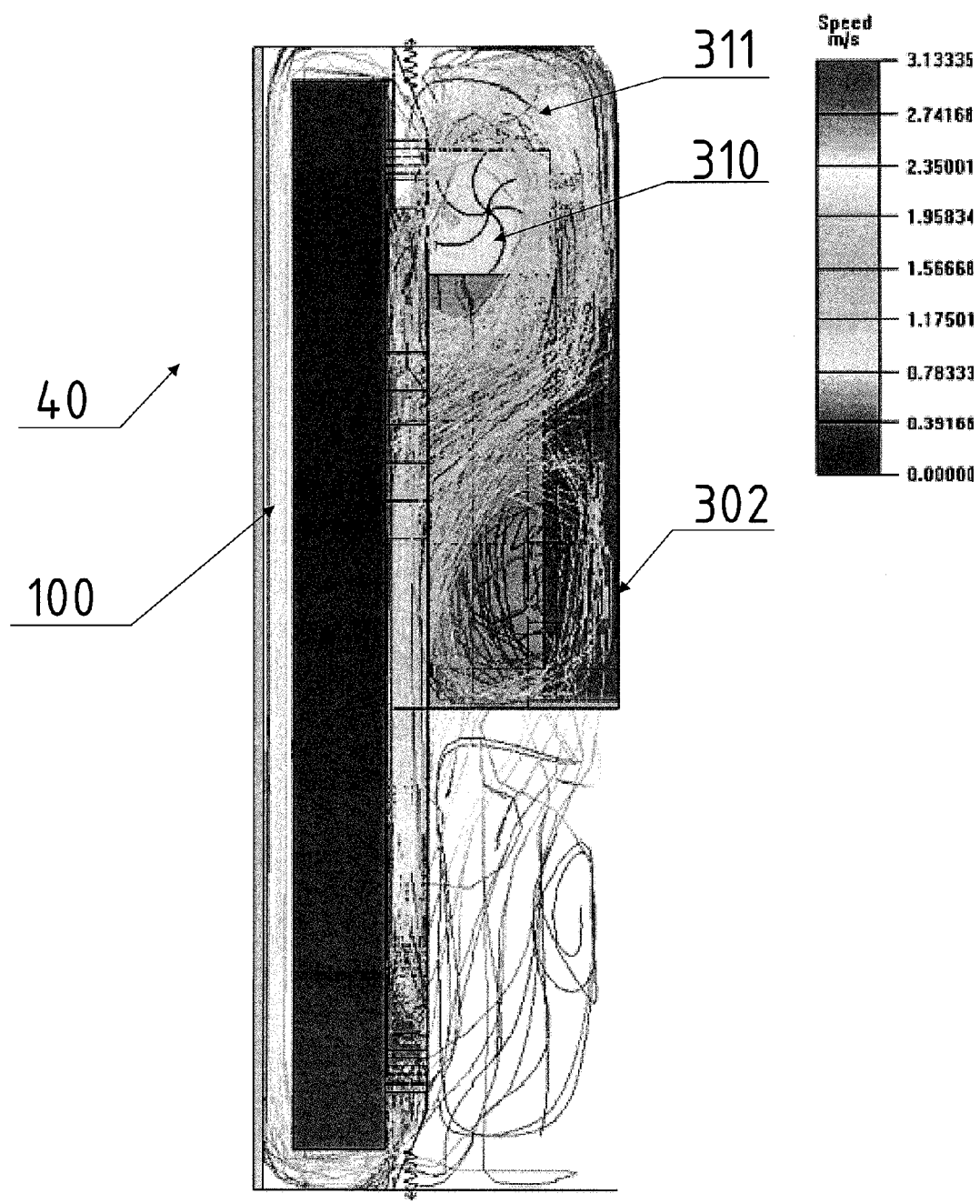
FIG. 15 is a sectional view of the embodiment of FIG. 13 showing the airflow pattern through the enclosure.
Figure 16:
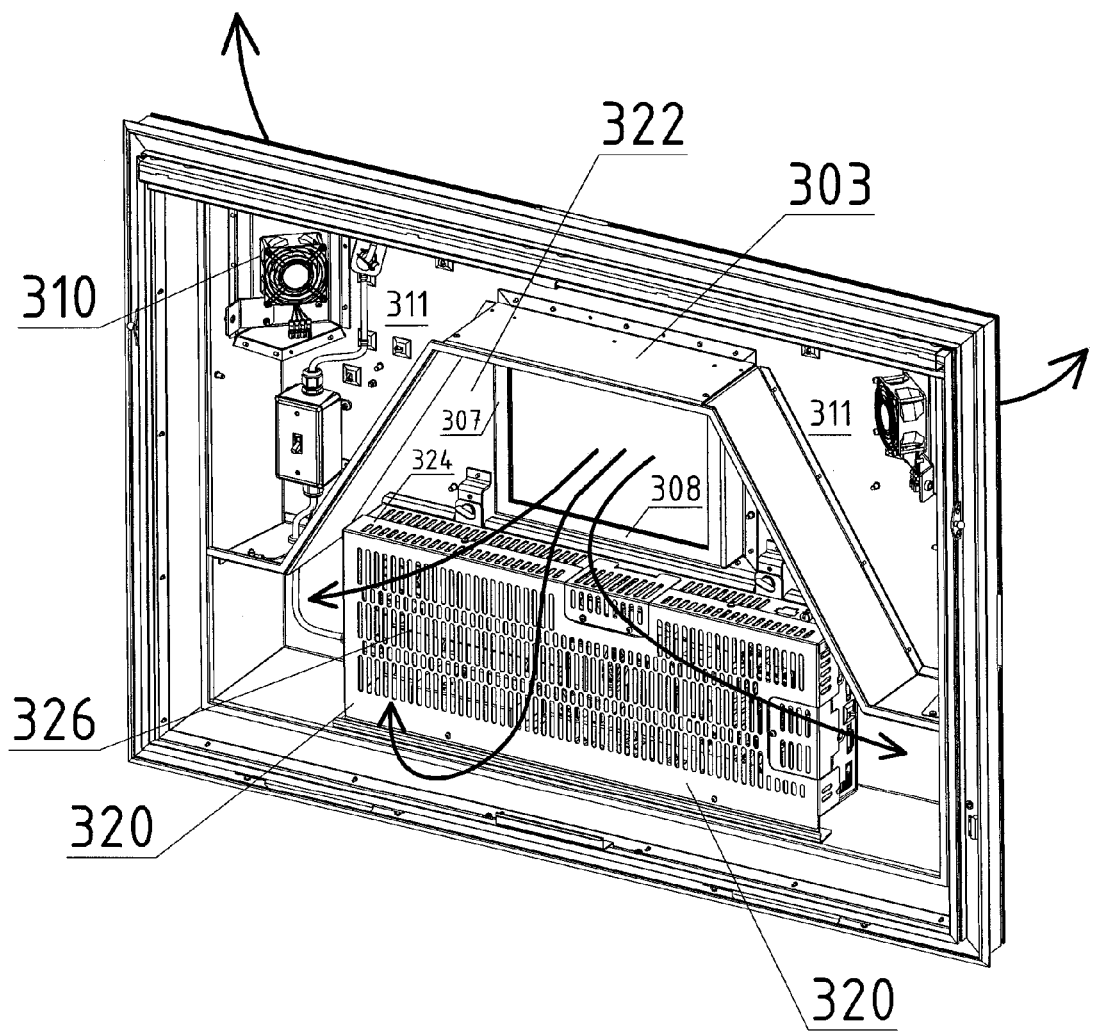
FIG. 16 is a perspective view, from the front, showing internal components of the embodiment of FIG. 13.
Figure 17:
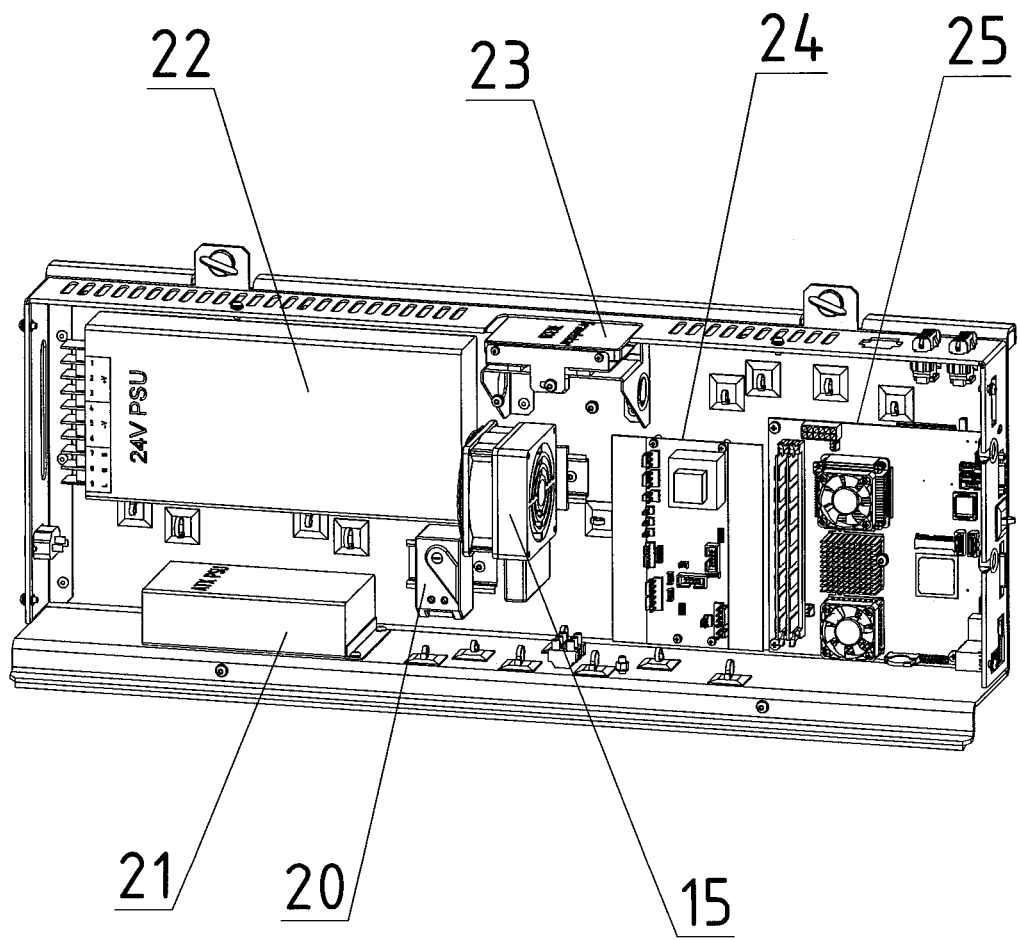
FIG. 17 is a perspective view of the ECU portion of the system.

Air circulation through enclosure 40 is shown by the arrows in FIG. 14, wherein ambient air enters the inlet manifold 306, and passes through membrane 308 into ECU compartment 302. A portion of the ambient air exits compartment 302 directly through openings 228 in the screen enclosure 220, and the remaining portion passes through heater/blower unit 320, where the air is optionally heated (if required) and accelerated by fan 312. The combined airstreams enter the screen enclosure 220, where a portion travels upwardly within the space between the rear surface of the FPD 100 and the rear panel 226 of the screen enclosure. The remaining ambient airflow is deflected around the bottom edge of the FPD and travels upwardly across the front face of the FPD. The respective airflows then enter the exhaust manifold 311, where they are vented by fan 310 out of the enclosure. FIG. 15 represents airflow through the enclosure, showing in particular the laminar flow achieved across the front and rear faces of FPD 100.

The heater component within the heater/blower unit 320 is a variable electrical resistance heater, and is particularly useful if the unit is intended to operate in a cold climate. For use in a consistently warm environment (such as an indoor or temperature environment) the heater may be dispensed with.

Figure 26:
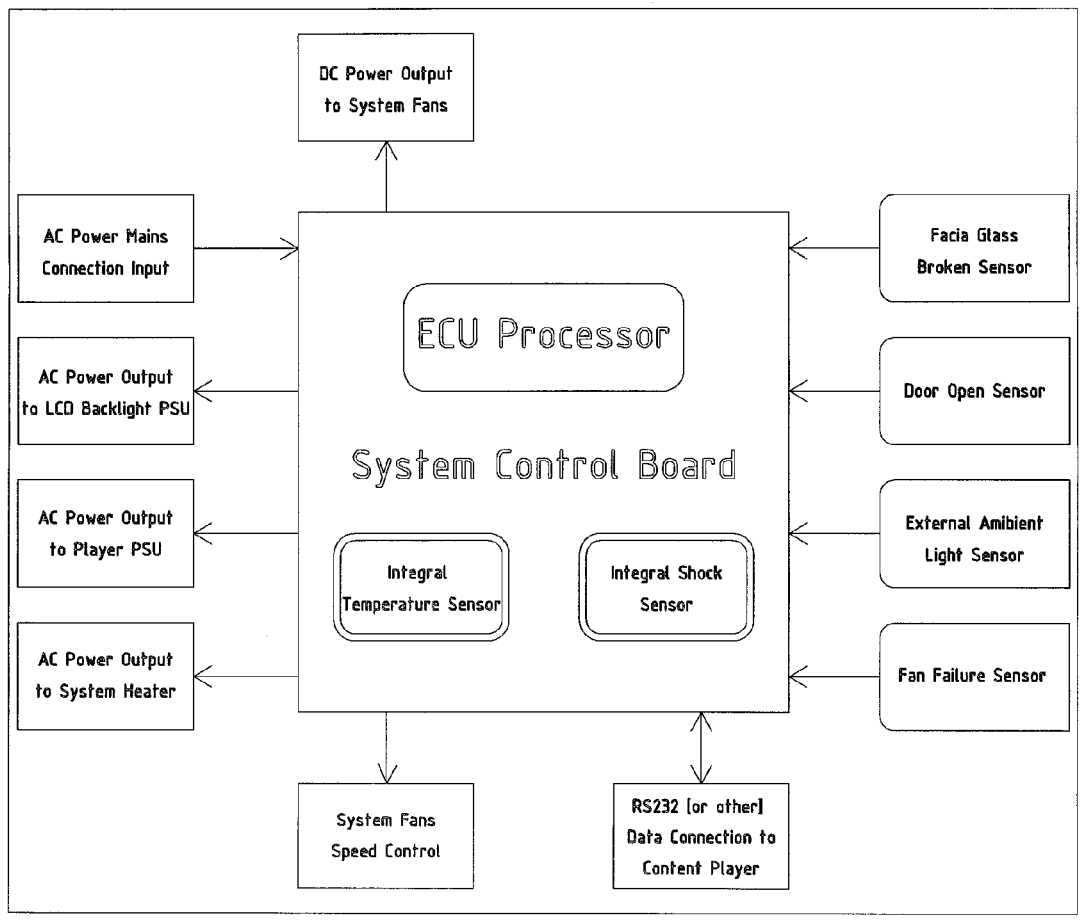
FIG. 26 is a block diagram showing operation of the environmental control system of the present invention.

Operation of the control system of ECU 300 is illustrated schematically in FIG. 26. ECU derives AC current from the mains feed. AC power passes from ECU 300 and is supplied as both DC and AC power, to components in the system. ECU 300 includes processor 500 that comprises firmware responsive to integral and attached external sensors. The ECU firmware includes integrated charts with user changeable fields to set the temperatures at which the system elements are switched. The firmware charts control the following components:

a) the on/off temperatures of equipment connected to the AC outputs b) the on/off temperature of heating elements in the system c) the on/off temperature settings and run-speed of exhaust cooling fans.

ECU 300 includes a data connection to the content player, preferably a Mini IPX PC, with the data connection comprising an RS232 port for the transfer of data signals from the processor.

ECU 300 can be interrogated, remotely via the data connection, from the content player, using a "read ECU" command to view firmware charts controlling the operation of the system.

According to a preferred control setting, the firmware is programmed to control the heater and fans in response to the internal temperature within the enclosure as follows:

|  | Temp | | | | | | | | |
| --- | --- | --- | --- | --- | --- | --- | --- | --- | --- |
|  | −40 C. | −30 C. | −20 C. | −10 C. | 0 C. | 10 C. | 20 C. | 30 C. | 40 C. |
| Heater | ON | ON | ON | ON | ON | OFF | OFF | OFF | OFF |
| Fans | OFF | OFF | OFF | OFF | OFF | OFF | ON 20% | ON 50% | ON 100% |

The firmware is programmed to turn power to the FPD off if the internal temperature is outside the above range.

According to one embodiment, the architecture of the ECU and electronic componentry is as follows:

1. Power Input
   AC mains supply feed 110V to 250V
   Main power switch—system disconnect
   Convenience outlet for peripheral equipment—optional
2. ECU—System Control Board
   AC Power feed from system disconnect switch
   AC Power distribution to all integrated equipment power supplies
   System sensors on the board, and connections for remote sensors by cable to various positions within the enclosure (temperature, shock/acceleration; ambient light, enclosure intrusion/security), with ECU being responsive to signals from said sensors to shut down power to said FPD or transmit an alarm signal to a remote recipient AC power distribution and (on/off) control, heating elements DC power distribution and (speed) control system (exhaust) fans Alarm reporting function to content player 3. Power Supply or Supplies Integrated player board AC/DC LCD backlight AC/DC 4. Environmental Control—System Enclosure Fan heater appliance to maintain enclosure internal ambient temperature within given parameters, determined by ECU firmware Speed controlled high capacity exhaust fans to remove excess heat and maintain enclosure internal ambient temperature within given parameters, determined by ECU firmware 5. Electronic Equipment Content player—Mini IPX format, ruggedized PC board, with video output to display(s) and network connection Data storage device(s)

Wireless adapter (optional)

Network device(s)

6. Display(s)

LCD module with integrated backlight and T-con board LVDS connection

Screen driver board with video feed from content player [may be eliminated if LVDS direct feed from player is available]

Figure 23:
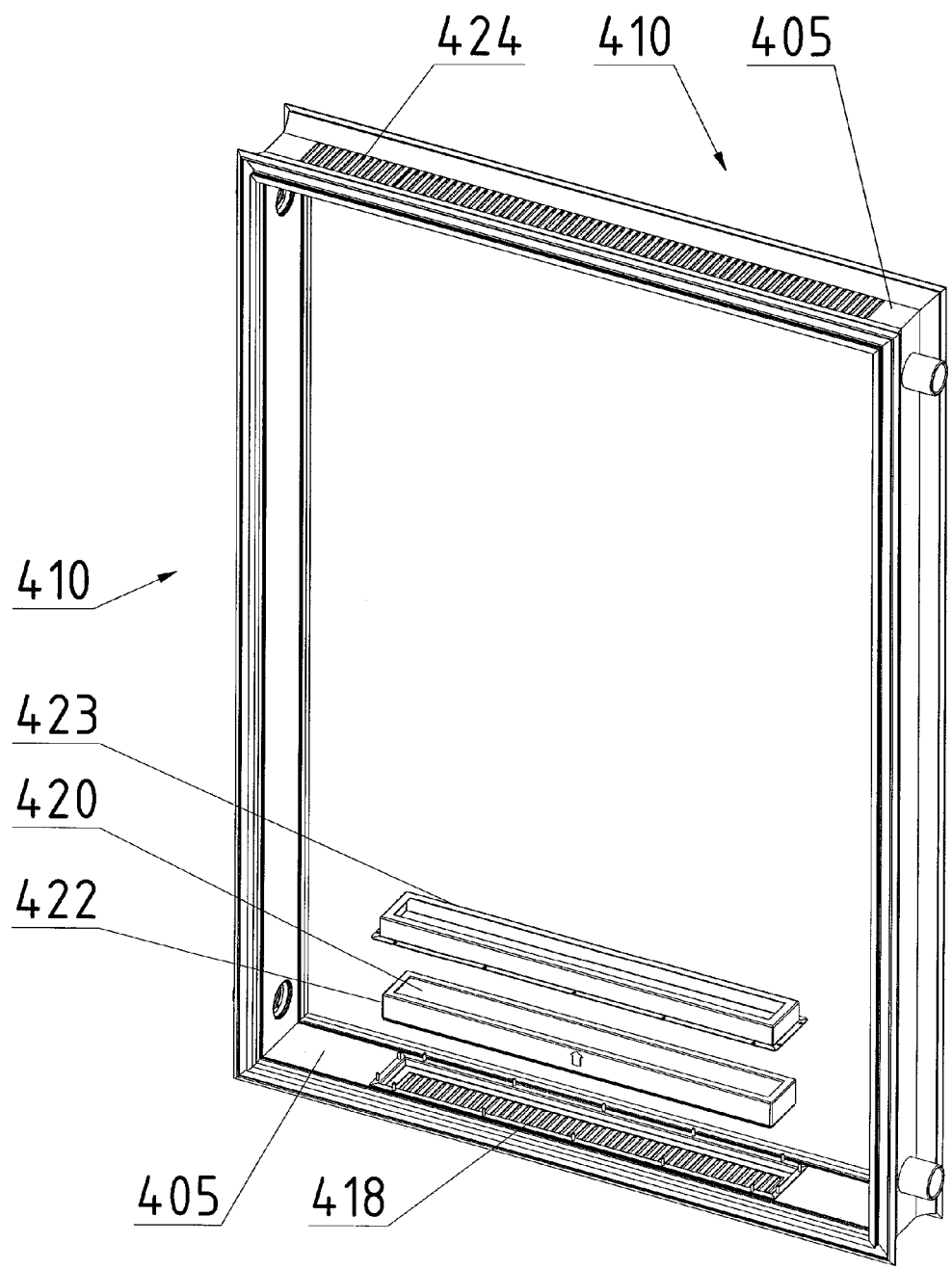
FIG. 23 is a perspective view of the FPD holder according to a seventh embodiment of the invention.
Figure 24:
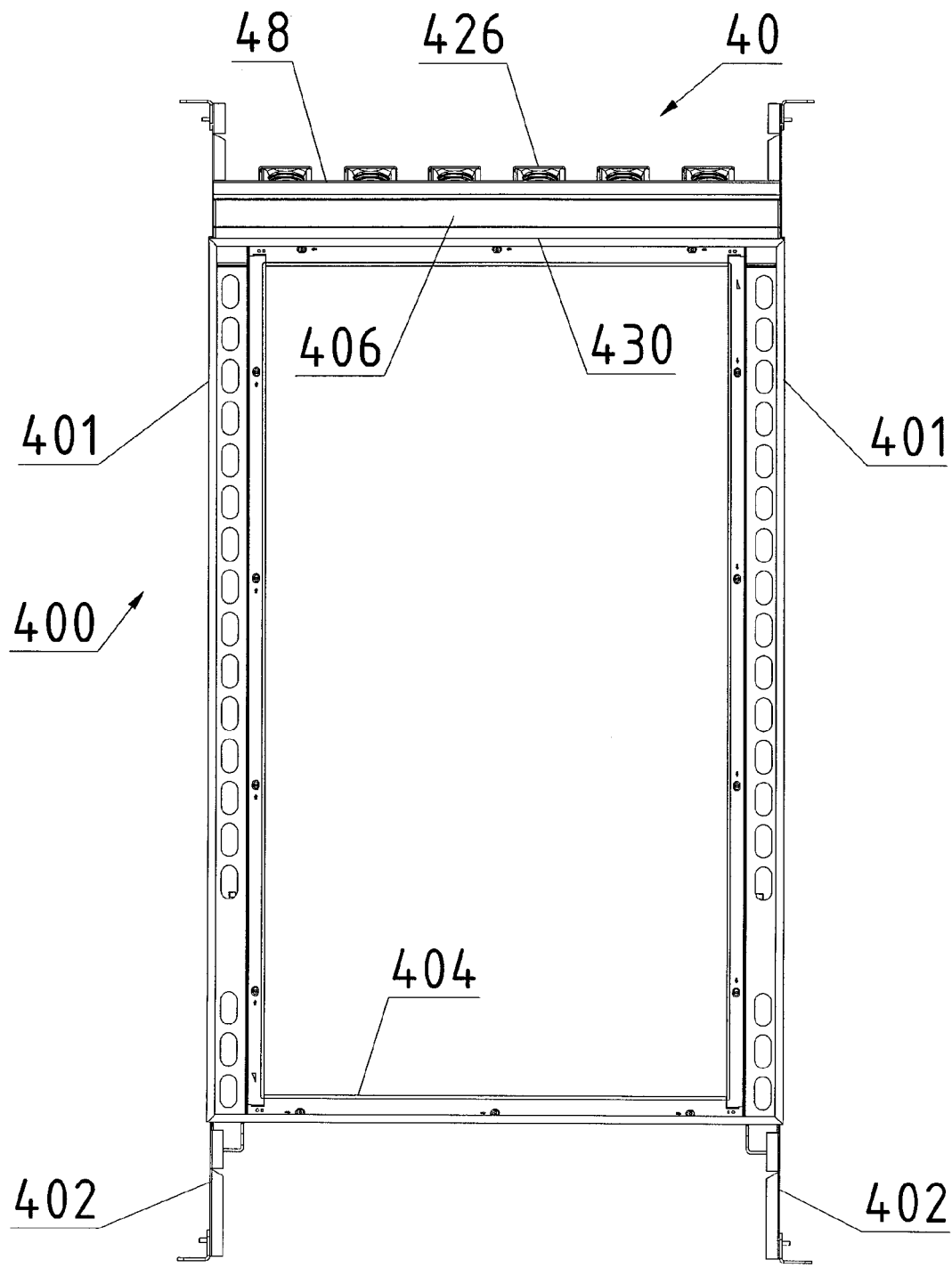
FIG. 24 is a front elevational view of the enclosure according to the seventh embodiment.
Figure 25:
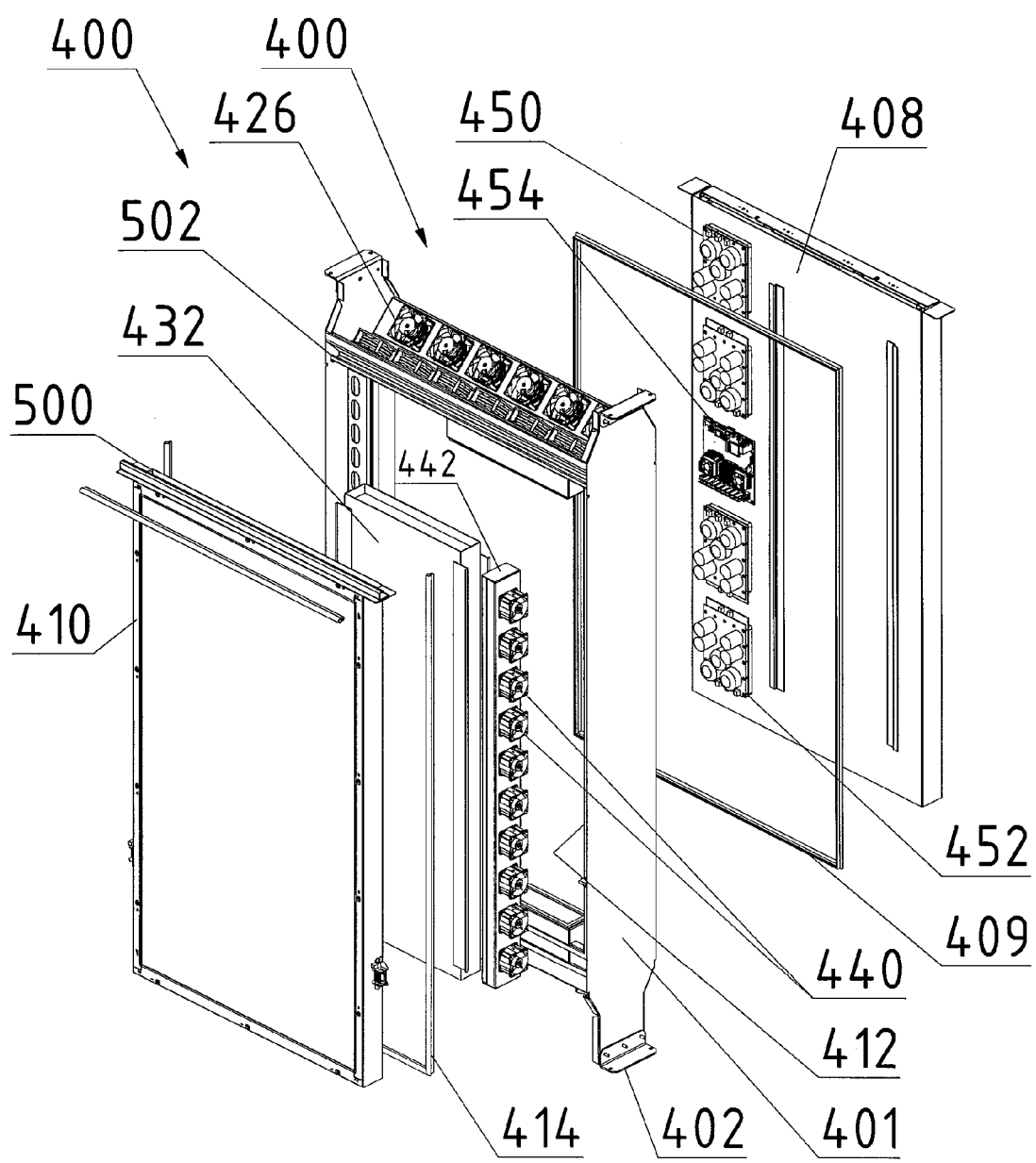
FIG. 25 is an exploded view, in perspective, of the seventh embodiment.

A seventh embodiment is shown in FIGS. 23-25, in which the enclosure 400 includes vertical spaced apart lateral sidewalls 401, having downwardly extending feet 402 (seen in FIGS. 24 and 25). Opposed bottom and top walls 404 and 406 and a rear panel 408 are fastened to the sidewalls 401 to define an interior space. The rear panel 408 is removable, and gasket 409 seals rear panel 408 to walls 404 and 406 and sidewalls 406. An FPD housing 410 installed within enclosure 400, with a gasket 414 providing a resilient seal where the FPD housing contacts the enclosure. The FPD housing 410 is hinged to enclosure 400 with mutually engaging flanges 500 and 502 in the same manner as described above in connection with the 6th embodiment hereof. When closed, the FPD housing fits within the interior of enclosure 400.

The FPD housing 410 includes a bottom wall 405. An air inlet 418, provides air access to the FPD housing through a slotted portion of the bottom wall. The air inlet is covered with an inlet plenum 422, which houses a semi-permeable membrane 420 to filter the incoming air as described above. The inlet plenum 422 is retained by a removable clamp 423. An air outlet 424 is provided within the upper wall 407 in a location opposed to inlet plenum 422 to receive the outflow of air from the enclosure.

A battery of exhaust fans 426 is mounted to the top wall 406 of enclosure 400. Top wall 406 includes an array of outlet openings 430 aligned with exhaust fans 426. Outlets 430 are aligned with and directly above outlet 424, to exhaust air from the interior of FPD housing 410. A heater core 432 is mounted to the rear panel 408 within the interior of outer enclosure 400 to provide additional heat, when necessary. Heater core 432 comprises an electrical resistance heater, as described above. Airflow within enclosure 400 is further driven by a battery of circulation fans 440, mounted in a vertical row within the interior of the enclosure. Circulation fans 440 are mounted on a vertical fan bracket 442, which mounts to the heater core 432. Circulation fans 440 function in a similar fashion to circulation fans 84 described above.

The airflow entering the enclosure is directed to flow over and around the FPD so as to maintain its temperature within the desired operating range. The fans, heating system and other active system components are controlled by the EDU as described above.

One or more FPD power supplies 450, system controller 452, and other electrical components are mounted to the rear panel within the interior of the enclosure.

The enclosure 400 of the seventh embodiment may be fitted within a video display module of any of the embodiments described above, including without limitation a multi-sided free standing display that incorporates multiple enclosures, or a mounted display unit. An audio system may be incorporated, as described above, and the images on FPD may be supplied by an on-site source or supplied remotely in the manner described above.

The present invention encompasses variations and departures from the detailed embodiments described herein. The full scope of the invention includes the present disclosure of the invention, including the detailed description of embodiments, as well as the invention as set forth in the accompanying claims, and all functional and mechanical equivalents of any elements described herein.

The invention claimed is:

1. A video screen enclosure system for displaying a flat panel video display unit ("FPD"), comprising a housing including spaced apart front and rear surfaces defining an interior space, a front panel member mounted to said housing with an airtight seal, said front panel member including a clear viewing panel, a mount for retaining said FPD within the interior space of said housing to provide an air gap between said FPD and said front and rear surfaces with said air gap at least partially surrounding said FPD, an air inlet to permit exterior air to enter into said housing, an air outlet to exhaust air from said housing, an air circulation subsystem to draw exterior air into said housing through said inlet and circulate ambient air within said housing, said front panel member being engaged to said housing with a first pivotal engagement and said FPD being engaged to said housing with a second pivotal engagement independent of said first pivotal engagement, said first and second pivotal engagements being configured to permit said panel member and said FPD respectively to pivot outwardly from said housing independently of each other along parallel axes of rotation to permit access into the interior of said housing, and at least one of said first and second pivotal engagements comprising mutually engaging surfaces configured to oppose each other and rest one upon the other.

2. A system as defined in claim 1 wherein said air circulation subsystem further comprises an inlet manifold, a speed-controlled fan, an exhaust outlet, and optionally at least one baffle configured to direct said laminar flow air current across front and rear faces of said FPD.

3. A system as defined in claim 1 wherein said mutually engaging surfaces comprise upwardly and downwardly projecting surfaces respectively, configured to interlock when engaged.

4. A system as defined in claim 1 further comprising struts connecting said front panel member and said FPD to said housing to retain said front panel member and FPD respectively in an open position, said struts having releasable mounts to permit rapid disconnection of said FPD and said front panel member from said housing.

5. A system as defined in claim 4 further comprising means to shut down power to said FPD when said interior temperature is outside said selected range.

6. A system as defined in claim 1 further comprising one or more sensors to detect intrusion into said enclosure, breakage of said front panel member, or movement of said enclosure, and an environmental control unit comprising means responsive to said sensors to shut down power to said FPD or transmit an alarm signal to a remote recipient.

7. A video screen enclosure system for displaying a flat panel video display unit ("FPD"), comprising a housing including spaced apart front and rear surfaces defining an interior space, a front panel member mounted to said housing with an airtight seal, said front panel member including a clear viewing panel, means to mount said FPD within said housing to provide an air gap between said FPD and said front and rear surfaces with said air gap at least partially surrounding said FPD, a fan to circulate air within said housing in a laminar flow pattern across front and rear faces of said FPD, a temperature sensor, an environmental control unit ("ECU") responsive to said temperature sensor configured to control said means to circulate air to maintain the interior temperature within said housing within a selected range suitable for operation of said FPD, and at least one baffle configured to direct said laminar flow air current across the front and rear faces of said FPD within said housing, said front panel member being engaged to said housing with a first pivotal engagement and said FPD being engaged to said housing with a second pivotal engagement independent of said first pivotal engagement, said first and second pivotal engagements being configured to permit said panel member and said FPD respectively to pivot outwardly from said housing independently of each other along parallel axes of rotation to permit access into the interior of said housing, and at least one of said first and second pivotal engagements comprising mutually engaging surfaces configured to oppose each other and rest one upon the other.

8. A system as defined in claim 1 further comprising an FPD positioned within the interior space.

9. A display system comprising a support frame and at least one video screen enclosure system as defined in claim 1 mounted to said frame configured to form a multi-sided display module wherein said video screen enclosure system forms comprises at least one side of said module.

10. A system as defined in claim 9 wherein said frame is configured to retain at least two of said enclosures in angled relationship to each other.

11. A system as defined in claim 10 comprising a substantially enclosed structure defining an interior space, wherein said enclosures face outwardly from said structure.

12. A system as defined in claim 9 configured to form a component of a transit shelter.

13. A system as defined in claim 9 configured as a triangular structure having three generally vertically oriented rectangular sidewalls at least one of which comprises said video screen enclosure system.

14. A system as defined in claim 1 wherein said air inlet further comprises a semi-permeable membrane for filtering incoming air.

15. A system as defined in claim 14 wherein said semi-permeable membrane blocks moisture.

16. A system as defined in claim 1 wherein said air circulation subsystem is configured to circulate air within said housing in a laminar flow air current across front and rear faces of said FPD.

* * * * *